United States Patent
Kawachi

(10) Patent No.: US 8,426,264 B2
(45) Date of Patent: Apr. 23, 2013

(54) THIN-FILM SEMICONDUCTOR DEVICE, LATERAL BIPOLAR THIN-FILM TRANSISTOR, HYBRID THIN-FILM TRANSISTOR, MOS THIN-FILM TRANSISTOR, AND METHOD OF FABRICATING THIN-FILM TRANSISTOR

(75) Inventor: Genshiro Kawachi, Chiba (JP)

(73) Assignee: Sharp Kabushiki Kaisha, Osaka (JP)

( * ) Notice: Subject to any disclaimer, the term of this patent is extended or adjusted under 35 U.S.C. 154(b) by 30 days.

(21) Appl. No.: 13/149,175

(22) Filed: May 31, 2011

(65) Prior Publication Data

US 2011/0230016 A1    Sep. 22, 2011

Related U.S. Application Data

(62) Division of application No. 11/760,926, filed on Jun. 11, 2007, now Pat. No. 7,977,752.

(30) Foreign Application Priority Data

Jun. 26, 2006   (JP) .................................. 2006-175473

(51) Int. Cl.
  *H01L 21/8238* (2006.01)
  *H01L 21/00* (2006.01)
(52) U.S. Cl.
  USPC ........................... 438/202; 438/151; 438/166
(58) Field of Classification Search .................. 438/135, 438/149, 151, 157, 166, 202, 205, 309; 257/E21.372, E27.112, E29.182
See application file for complete search history.

(56) References Cited

U.S. PATENT DOCUMENTS

| | | | |
|---|---|---|---|
| 5,508,550 A | 4/1996 | Morishita et al. | |
| 5,510,647 A | 4/1996 | Nakajima et al. | |
| 6,084,248 A * | 7/2000 | Inoue | 257/66 |
| 7,288,787 B2 | 10/2007 | Nakazaki et al. | |
| 7,410,848 B2 * | 8/2008 | Jyumonji et al. | 438/166 |
| 7,646,019 B2 | 1/2010 | Kimura | |
| 7,791,077 B2 | 9/2010 | Kawachi | |
| 2010/0289027 A1 | 11/2010 | Kawachi | |
| 2010/0289028 A1 | 11/2010 | Kawachi | |

FOREIGN PATENT DOCUMENTS

| | | |
|---|---|---|
| JP | 4-93032 A | 3/1992 |
| JP | 6-151859 A | 5/1994 |
| JP | 6-275630 A | 9/1994 |
| JP | 10-32337 A | 2/1998 |
| JP | 2002-176350 | 6/2002 |
| JP | 2002-367905 A | 12/2002 |
| JP | 2003-76345 | 3/2003 |
| JP | 2004-327854 | 11/2004 |

(Continued)

OTHER PUBLICATIONS

Office Action issued Oct. 30, 2012 in Japanese Patent Application No. 2007-165527 with English language translation.

(Continued)

*Primary Examiner* — Hung Vu

(57) ABSTRACT

In a lateral bipolar transistor including an emitter, a base and a collector which are formed in a semiconductor thin film formed on an insulating substrate, the semiconductor thin film is a semiconductor thin film which is crystallized in a predetermined direction. In addition, in a MOS-bipolar hybrid transistor formed in a semiconductor thin film formed on an insulating substrate, the semiconductor thin film is a semiconductor thin film which is crystallized in a predetermined direction.

9 Claims, 26 Drawing Sheets

FOREIGN PATENT DOCUMENTS

| | | |
|---|---|---|
| JP | 2005-18088 | 1/2005 |
| JP | 2006-49862 A | 2/2006 |
| JP | 2006-165510 A | 6/2006 |
| WO | WO 03/092061 A1 | 11/2003 |

OTHER PUBLICATIONS

B-Y. Tsaur, et al., "Fully Isolated Lateral Bipolar-MOS Transistors Fabricated in Zone-Melting-Recrystallized Si Films on $SiO_2$," IEEE Electron Device Letters, vol. EDL-4, No. 8, Aug. 1983, pp. 269-271.

James C. Sturm, et al., "A Lateral Silicon-on-Insulator Bipolar Transistor with a Self-Aligned Base Contract," 0741-3106/87/0300-0104, IEEE, 1987, 3 pages.

Stephen Parke, et al., "A Versatile, SOI BiCMOS Technology with Complementary Lateral BJT's," IEDM, IEEE, 1992, pp. 453-456.

T. Shino, at al., A 31 GHz $f_{max}$, Lateral BJT on SOI Using Self-Aligned External Base Formation Technology, IEDM, IEEE, 1998. pp. 953-956.

Richard McCartney, et al., "9.3: WhisperBus™: An Advanced Interconnect Link for TFT Column Driver Data," SID 01 Digest, pp. 1-4, Jun. 2001.

* cited by examiner

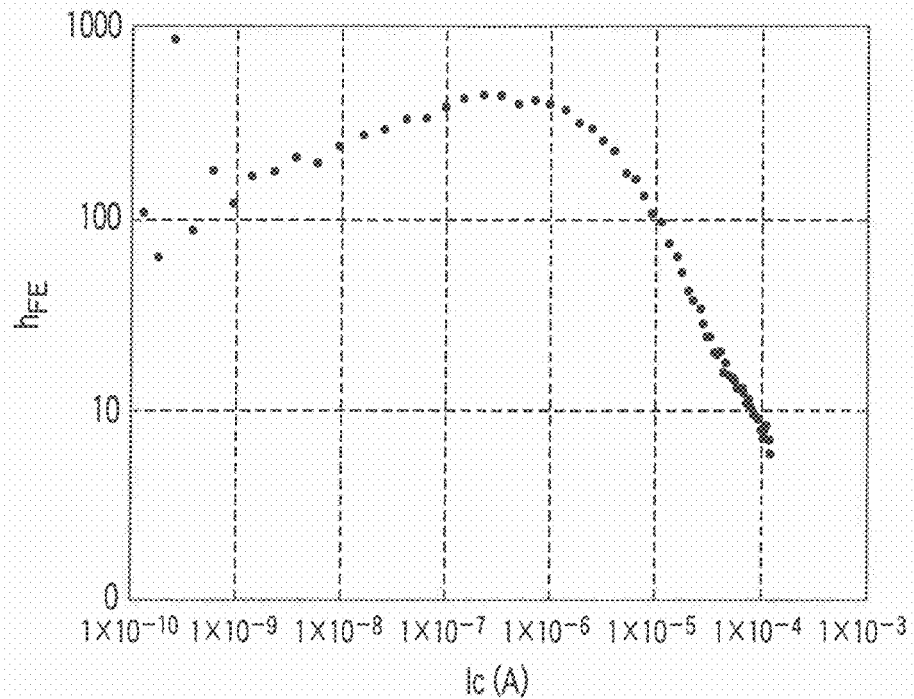
F I G. 15
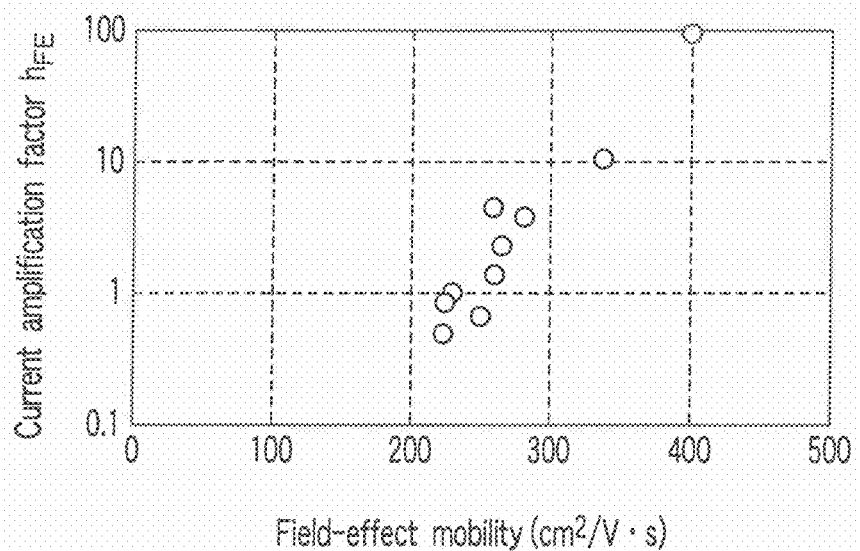
F I G. 16

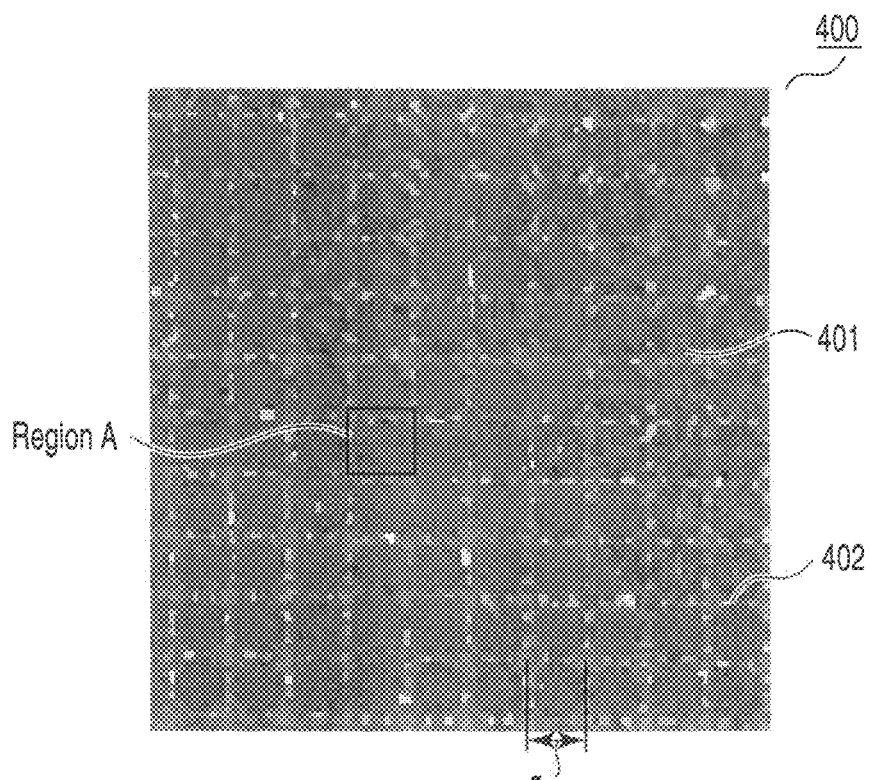
F I G. 19
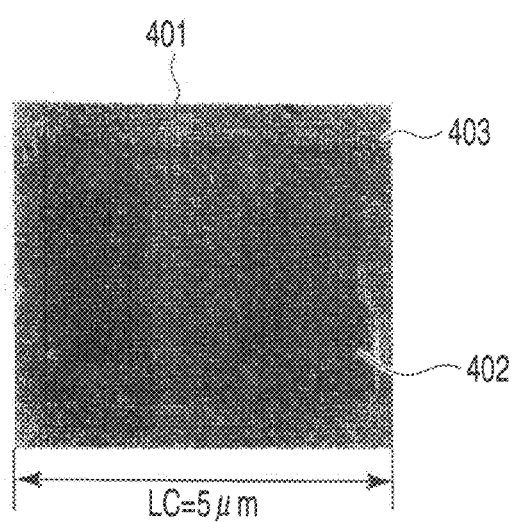
F I G. 20

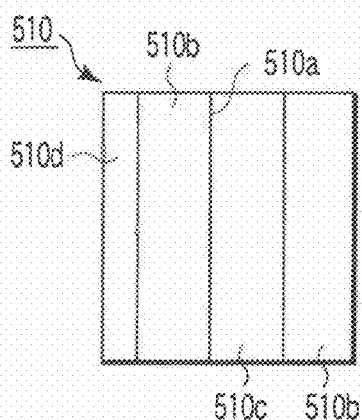
F I G. 21
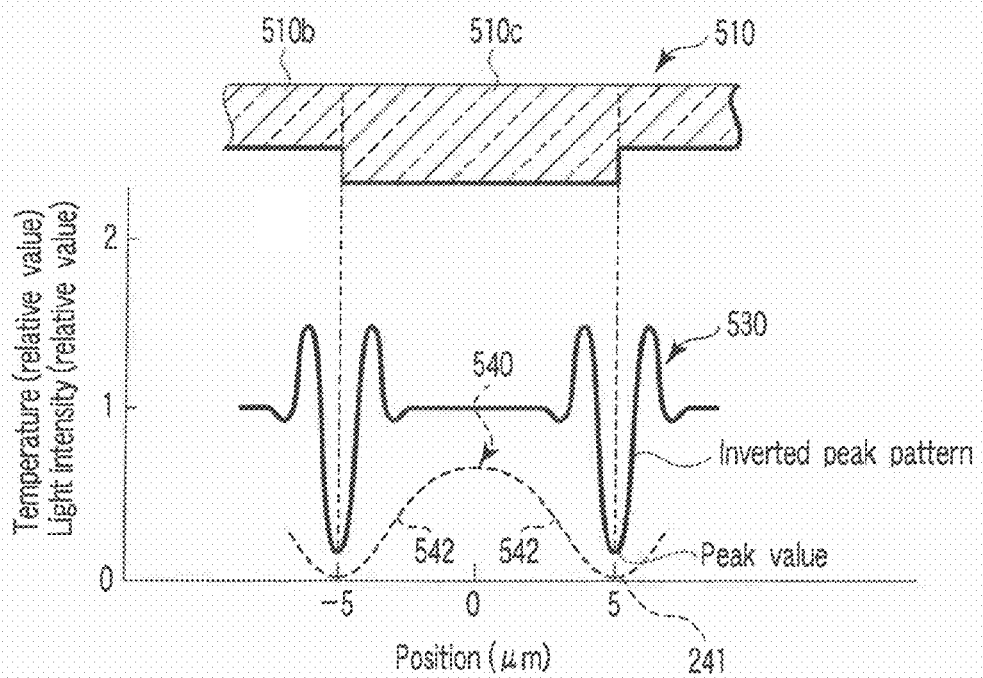
F I G. 22

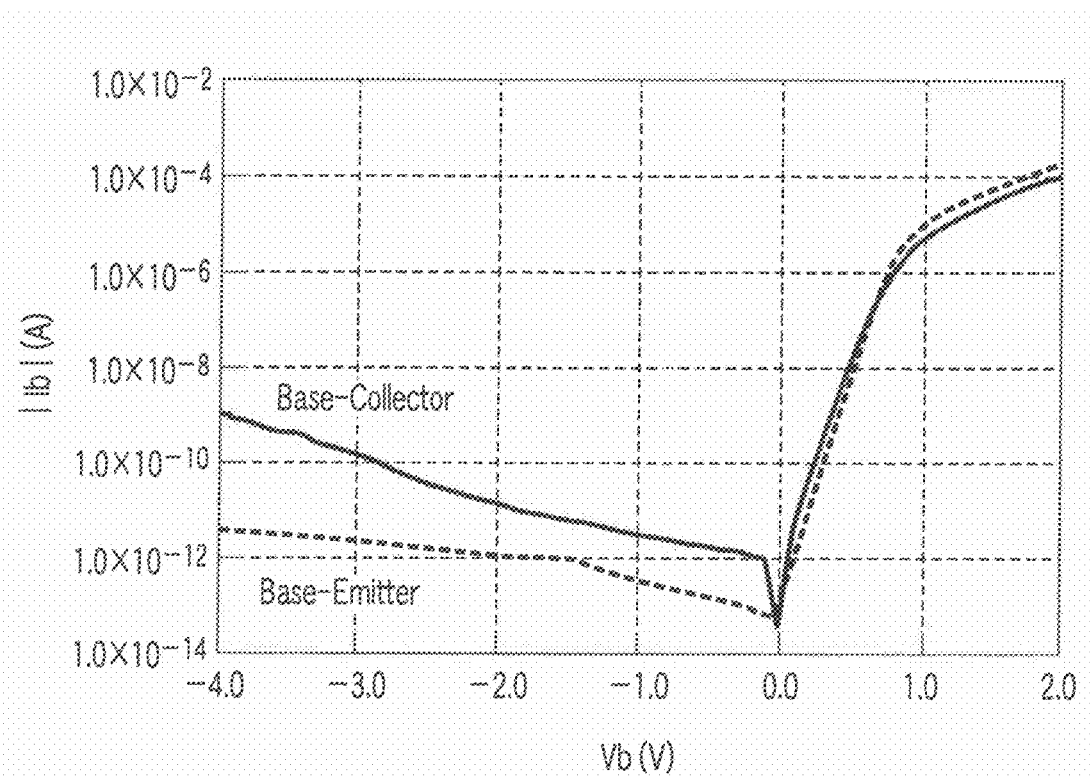
F I G. 31

THIN-FILM SEMICONDUCTOR DEVICE, LATERAL BIPOLAR THIN-FILM TRANSISTOR, HYBRID THIN-FILM TRANSISTOR, MOS THIN-FILM TRANSISTOR, AND METHOD OF FABRICATING THIN-FILM TRANSISTOR

CROSS-REFERENCE TO RELATED APPLICATIONS

This application is a division of and claims the benefit of priority under 35 U.S.C. §120 from U.S. Ser. No. 11/760,926, filed Jun. 11, 2007, and claims the benefit of priority under U.S.C. §119 from prior Japanese Patent Application No. 2006-175473, filed Jun. 26, 2006, the entire contents of both of which are incorporated herein by reference.

BACKGROUND OF THE INVENTION

1. Field of the Invention

The present invention relates to a thin-film transistor which is formed on an insulating substrate.

2. Description of the Related Art

As a display device of, e.g. OA equipment, which displays image information and character information, there is known an active-matrix flat-panel display which uses thin-film transistors (TFTs). In recent years, with the development of multi-media communication technologies, attention has been paid to an integrated-function type display as a next-generation display, which is called a "system-on-panel" display. This integrated-function type display is designed for personal use, has a small size and light weight, and has a high resolution and a high image quality. Moreover, peripheral functions relating to image display, such as driver circuits, memory circuits, DA converters and image processing circuits, are integrated on a display panel.

Conventionally, MOS (Metal Oxide Semiconductor) transistors, which fall in a category of field-effect transistors, are mainly used as TFTs which are formed on a display glass substrate. The MOS transistors are widely used since the MOS transistors can advantageously constitute digital circuits such as shift registers and display pixel switches of displays.

In recent years, attempts have been made to increase the added values of display devices by integrating various functions, aside from a display function, on the display substrate. Jpn. Pat. Appln. KOKAI Publication No. 2005-18088, for instance, discloses a liquid crystal display device having an input function using light from, e.g. a light pen, by providing photoelectric conversion elements in individual pixels.

In the case of the above-described example, a function of detecting and amplifying a photoelectric current is needed. However, in a source-grounded type amplifying circuit which is composed of MOS transistors, an input impedance is high and the photoelectric current cannot directly be amplified. In such a case, the photoelectric current is received by providing a current buffer circuit having a gate-grounded structure. In order to obtain a sufficient gain with the MOS transistor alone, however, the circuit structure becomes complex. Thus, there is the problem that a sufficient detection sensitivity is hardly obtained with a simple-structured circuit.

On the other hand, a bipolar transistor is known as a transistor in which a current is input as an input signal. In the case of using a single-crystal Si or SOI (Silicon On Insulator) substrate, the BiCMOS (bipolar CMOS) technology has already been established in which bipolar transistors and CMOS transistors are provided on the same substrate in a hybrid fashion, and these transistors are selectively used, as needed. In conventional techniques, however, it is difficult to implement such a structure that two kind of devices are provided in a hybrid fashion on a low-heat-resistant substrate such as a glass substrate. The inventor of the present invention studies techniques for meeting this demand, and has found that the reason for this is that a minimum processing dimension, which is realized on a large-sized glass substrate of, e.g. about 1 m, is about 3 microns at most. Moreover, another reason appears to be that the crystal quality of a Si thin film, which can be formed on a glass substrate at low temperatures, is poor, and a minor carrier lifetime in the Si thin film layer is too short to invoke the bipolar action.

BRIEF SUMMARY OF THE INVENTION

The present invention has been made in consideration of the above-described problems, and the object of the invention is to provide a thin-film transistor, a hybrid thin-film transistor, a MOS thin-film transistor and a thin-film semiconductor device, in which at least one kind of transistor, such as a lateral bipolar thin-film transistor or a MOS thin-film transistor, is formed on a semiconductor thin film that is provided on a low-heat-resistant insulating substrate.

For example, the object of the invention is to provide a device structure in which a MOS transistor and a bipolar transistor can be integrated on a glass substrate, and to provide a method of fabricating this device structure.

In order to achieve the above-described object, the embodiments of the present invention include the following structures.

According to an embodiment of the invention, there is provided a thin-film semiconductor device including: at least one MOS transistor including a source region, a channel region and a drain region, which are formed in a semiconductor thin film formed on an insulating substrate, and including a gate electrode formed on a surface of the channel region via an insulation film; and at least one lateral bipolar transistor including an emitter, a base and a collector, which are formed in a semiconductor thin film formed on the same insulating substrate as the MOS transistor.

According to another embodiment of the invention, there is provided a method of fabricating a thin-film transistor, comprising: a step of forming a non-single-crystal semiconductor thin film on an insulating substrate; a step of radiating a pulse laser beam with an inverted peak pattern shape on the non-single-crystal semiconductor thin film, thereby forming a crystallized region; and forming at least one kind of a lateral bipolar thin-film transistor and a MOS thin-film transistor in the crystallized region.

According to still another embodiment of the invention, there is provided a lateral bipolar transistor including an emitter, a base and a collector, which are formed in a semiconductor thin film formed on an insulating substrate, the semiconductor thin film being a semiconductor thin film which is crystallized in a predetermined direction.

According to still another embodiment of the invention, there is provided a MOS-bipolar hybrid thin-film transistor including an emitter, a base and a collector which are formed in a semiconductor thin film formed on an insulating substrate, and a lead-out electrode connected to the base, a gate electrode being formed on a surface of the base region via an insulation film, the base lead-out electrode and the gate electrode being connected so as to have an equal potential, the emitter functioning also as a source of a MOS transistor, the base functioning also as a channel of the MOS transistor, and the collector functioning also as a drain of the MOS transistor, wherein the semiconductor thin film is a semiconductor thin film which is crystallized in a predetermined direction.

According to still another embodiment of the invention, there is provided a MOS thin-film transistor including a source region, a channel region and a drain region which are formed in a semiconductor thin film formed on an insulating substrate, and including a gate electrode formed on a surface of the channel region via an insulation film, wherein the semiconductor thin film is a semiconductor thin film which is crystallized in a predetermined direction, and the source is disposed on a crystal growth start point side of the crystallized semiconductor thin film, and the drain is disposed on a crystal growth termination point side of the crystallized semiconductor thin film.

In the above structures, at least one kind of thin-film transistor, such as a lateral bipolar thin-film transistor or a MOS thin-film transistor, can be provided on a low-heat-resistant insulating substrate. Moreover, it is possible to provide a device structure in which a MOS transistor and a bipolar transistor can be integrated on a glass substrate, and a method of fabricating the device structure.

BRIEF DESCRIPTION OF THE SEVERAL VIEWS OF THE DRAWING

FIG. 15 is a graph showing the collector current dependency of the current amplification factor of the thin-film transistor according to the second embodiment of the invention;

FIG. 16 is a graph showing the relationship between the current amplification factor and field-effect mobility of the thin-film transistor according to the second embodiment of the invention;

FIG. 19 is an electron microscopic image of a crystal array pattern which can be used in the first and second embodiments of the invention;

FIG. 20 is an enlarged view of the electron microscopic image of the crystal array pattern which can be used in the embodiment of the invention;

FIG. 21 shows a phase shift mask which is used in order to obtain a single-crystal array in the embodiment of the invention;

FIG. 22 shows a cross section of the phase shift mask, a light intensity distribution of a laser beam and a temperature distribution in the embodiment of the invention;

FIG. 31 is a graph showing diode characteristics of the base-collector junction and base-emitter junction in the same device;

DETAILED DESCRIPTION OF THE INVENTION

Embodiments of the present invention will now be described with reference to the accompanying drawings.

First Embodiment

Figure 1:
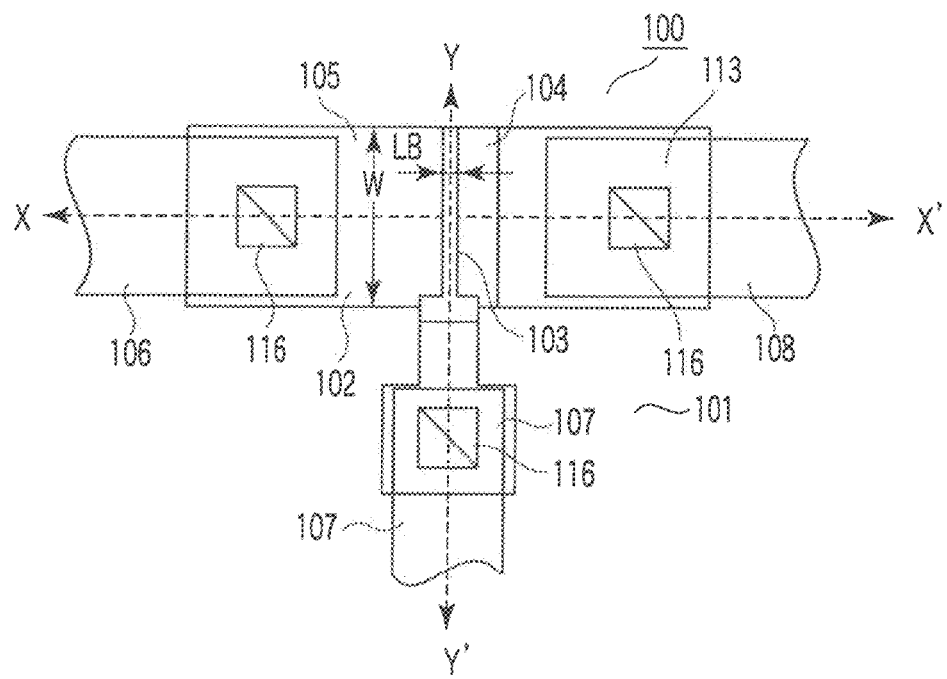
FIG. 1 is a plan view of a thin-film transistor according to a first embodiment of the present invention.
Figure 2:
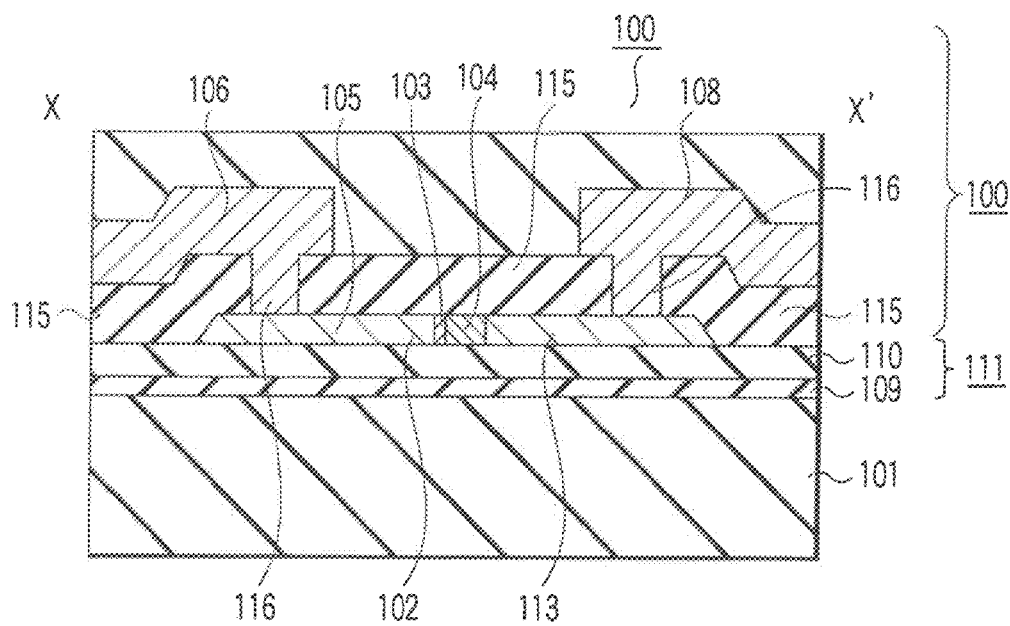
FIG. 2 is a cross-sectional view, taken along line X-X' in FIG. 1, showing the thin-film transistor of FIG. 1.
Figure 3:
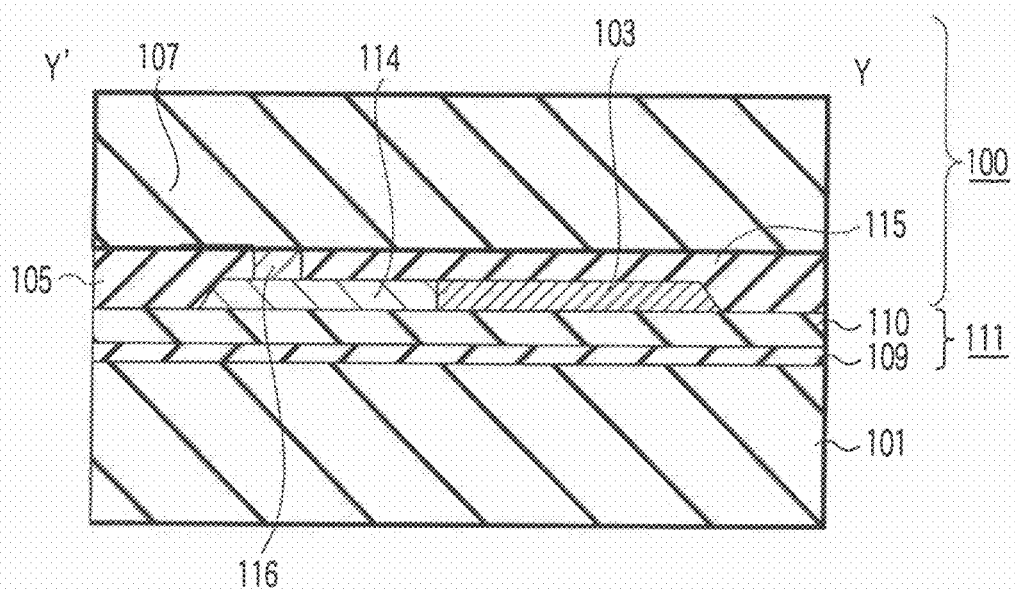
FIG. 3 is a cross-sectional view, taken along line Y-Y' in FIG. 1, showing the thin-film transistor of FIG. 1.

FIG. 1 is a plan view of a bipolar transistor 100 according to a first embodiment of the present invention, which is formed on a non-alkali glass substrate 101. FIG. 2 is a cross-sectional view taken along line X-X' in FIG. 1. FIG. 3 is a cross-sectional view taken along line Y-Y' in FIG. 1.

FIG. 1 to FIG. 3 show an emitter 102, a base 103 and a collector 104 which are formed in a crystallized semiconductor thin film 105. The semiconductor thin film 105 is crystallized in a predetermined direction. The semiconductor thin film 105 crystallized in the predetermined direction is a crystal region which is crystallized in a lateral direction (horizontal direction) by irradiating a semiconductor thin film with a pulse laser beam having, e.g. a light intensity distribution with an inverted peak pattern. The semiconductor thin film 105 crystallized in the predetermined direction can be formed by a crystallizing method which will be described later in detail. An emitter electrode 106, a base electrode 107 and a collector electrode 108 are formed on the semiconductor thin film 105.

As shown in FIG. 2 and FIG. 3, the entirety of the bipolar transistor 100 is formed on a buffer insulation film 111. The buffer insulation film 111 comprises an SiNx film 109 with a thickness of, e.g. 50 nm and an SiO$_2$ film 110 with a thickness of, e.g. 100 nm, which are formed on the non-alkali glass substrate 101. The buffer insulation film 111 functions to prevent diffusion of impurities from the glass substrate 101. The structure of the buffer insulation film 111 is not limited to this example. For instance, the buffer insulation film 111 may be formed of an SiO$_2$ film alone, or an SiNx film alone. The substrate that is usable is a substrate with low heat resistant, and is not limited to the non-alkali glass substrate. For example, a quartz substrate, a plastic substrate, or a silicon substrate having an SiO$_2$ film on its surface may be used.

Figure 4:
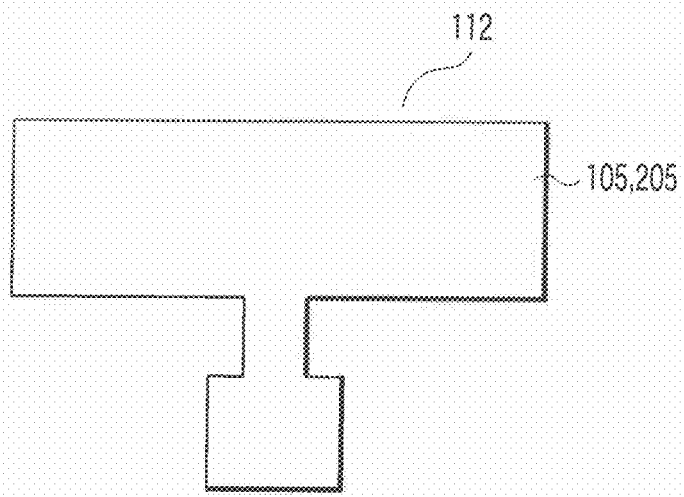
FIG. 4 shows a pattern of a semiconductor thin-film region in the first embodiment of the invention.

As shown in FIG. 4, an insular-region pattern 112 is formed on the SiO$_2$ film 110. The pattern 112 is formed of a crystallized semiconductor thin film which constitutes the transistor 100 and has a substantially T-shape with a thickness of 200 nm, for example, an Si film which is crystallized in a predetermined direction. The semiconductor material is not limited to Si, and other materials, such as Ge and GaAs, are usable. In addition, the film thickness is not limited to 200 nm. The crystallized Si film may be an entirely crystallized Si film formed on the buffer insulation film 111, or may be an Si film in which only the transistor formation region is crystallized.

The N$^+$ doped emitter 102, N$^-$ doped collector 104, N$^+$ doped collector contact portion 113, P$^-$ doped base 103 and P$^+$ doped base contact portion 114 are formed in the crystallized Si film 105.

Electrode wiring lines (106, 107, 108), which are formed of three-layer metal films of, e.g. Ti/Al/Ti, are connected to the upper surface of the Si film 105 via contact through-holes 116 which are formed in a first interlayer insulation film 115 that is formed of, e.g. an SiO$_2$ film. A second interlayer insulation film 22, which is formed of, e.g. an SiO$_2$ film, is formed so as to cover the entirety of the above-described parts.

The width W of the base region 103 is 5 μm and the length (equal to the distance between the emitter and collector) LB is 1.0 μm in the present embodiment. The emitter 102 is doped with phosphorus at a concentration of $1 \times 10^{20}$ (cm$^{-3}$). In this embodiment, the base is doped with boron at a concentration of $1 \times 10^{16}$ (cm$^{-3}$), and the base contact portion 114 is doped with boron at a concentration of $1 \times 10^{20}$ (cm$^{-3}$). The collector 104 is doped with phosphorus at a concentration of $1 \times 10^{17}$ (cm$^{-3}$), and the collector contact portion 113 is doped with phosphorus at a concentration of $1 \times 10^{20}$ (cm$^{-3}$). These selective doping processes can be carried out by using ion implantation techniques in ordinary semiconductor fabrication technologies. The dopants are not limited to the above-mentioned materials. The structure of this embodiment is the structure of an NPN-type lateral bipolar thin-film transistor device in which an electric current is caused to flow not in a film thickness direction of the Si film but in a horizontal direction, thereby to enable simultaneous formation with a MOS transistor. The base contact is led out from a side portion of the base. The first embodiment is not limited to the NPN-type lateral bipolar thin-film transistor device, and it may be a PNP-type lateral bipolar thin-film transistor device.

The operation of the transistor 100 is the same as that of an ordinary bipolar transistor. An emitter-collector current is controlled by flowing a base current between the base 103 and emitter 102 while applying a positive voltage to the collector 104.

In the lateral bipolar thin-film transistor, the most important parameters which determine the current amplification factor hFE are the crystal quality of the Si film and the base length LB. An adequate quality of the Si film can be obtained by using a crystal film with a length of several micrometers or more by adopting a lateral crystal growth method using a laser, as will be described later. In this case, it is desirable that the direction of movement of carriers in the lateral bipolar transistor be parallel to the direction of crystallization of the semiconductor thin film. The reason is that moving carriers hardly cross crystal grain boundaries. In addition, it was found that it is important that the base length LB should be set at 2 μm or less, preferably 1 μm or less, in order to secure a high hFE. As regards the polycrystalline silicon TFT that is used in the conventional display, the lifetime of holes is short and the formation of the base with the length of 1 μm or less is difficult due to restrictions of lithography. It is thus difficult to obtain a high hFE in the conventional polycrystalline silicon TFT.

In the structure in which the contact is led out from the side portion as shown in FIG. 1, the design of the width W of the transistor is important. The bipolar operation takes place only in the region where holes injected from the base are present. The density of holes decreases in a direction away from the side-surface contact. The degree of decrease is determined by the diffusion length of holes in the Si film. According to the inventors' simulation, it was found that the density of holes remarkably decreases at a distance of 5 μm or more from the side-surface portion and a collector current hardly flows. It is thus desirable to set the width W of the base at about 5 μm or less, preferably 3 μm or less.

Figure 5:
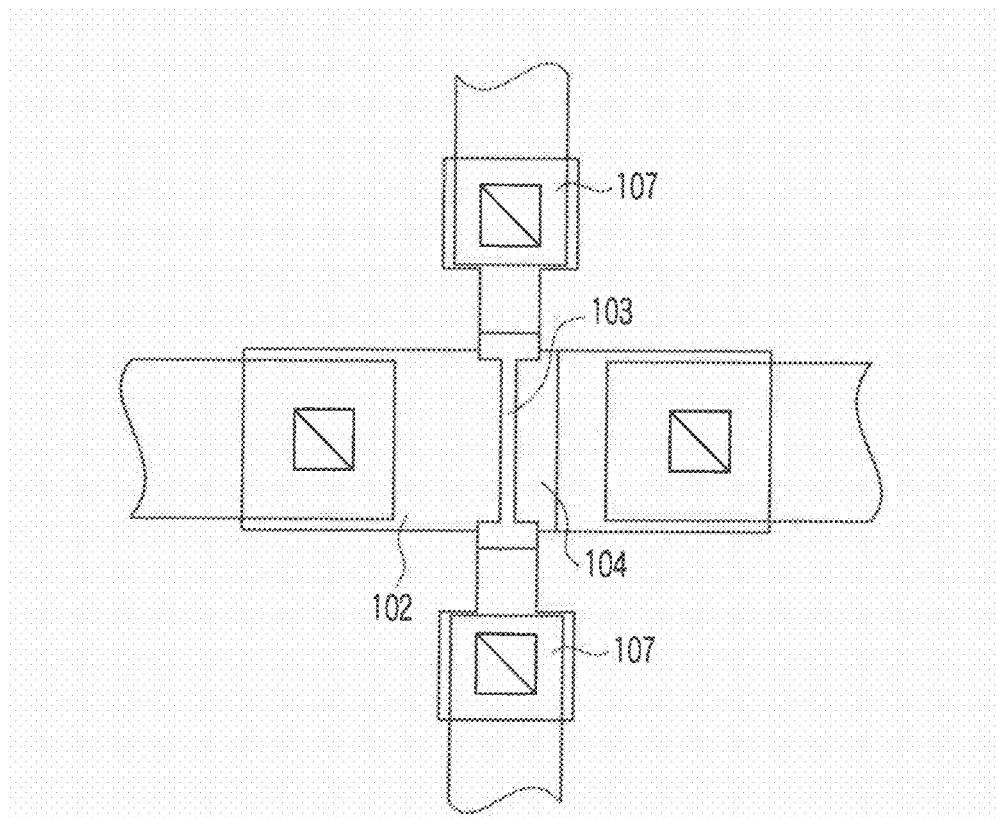
FIG. 5 is a plan view of a thin-film transistor in which a base electrode is led out of both sides of a base layer in the first embodiment of the invention.
Figure 6:
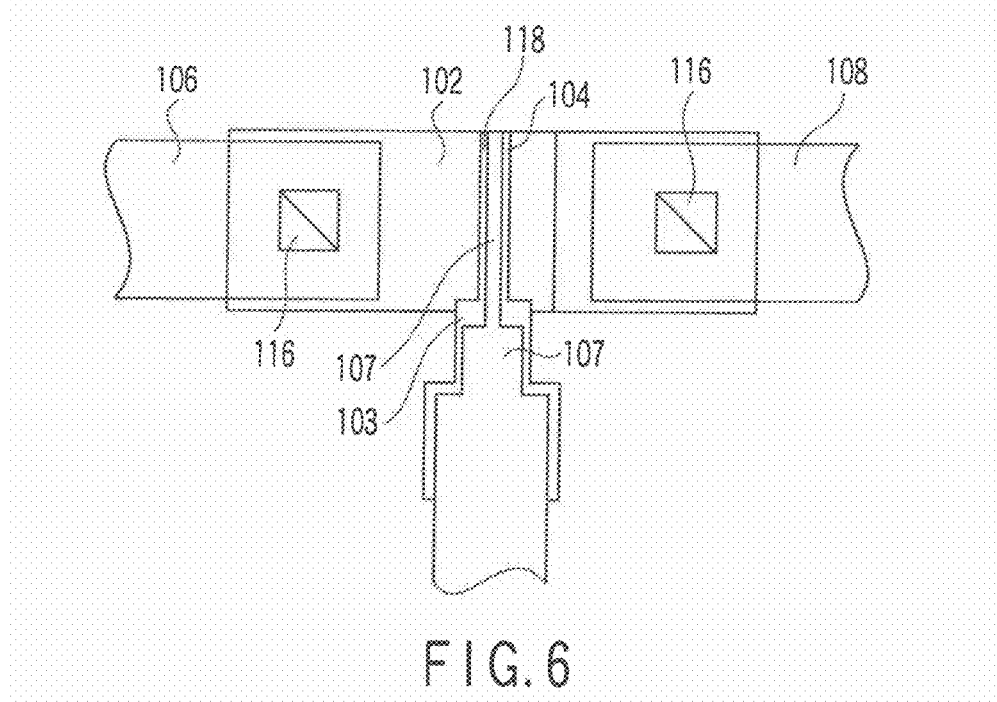
FIG. 6 is a plan view of a thin-film transistor in which a base electrode is directly formed in a substantial base region in the first embodiment of the invention.

In FIG. 1, the contact is led out from only one side surface of the base. Alternatively, as shown in FIG. 5, the contact may be led out from both sides of the base. Thereby, the width of the effective Si film that functions as the bipolar transistor can be increased, and thus the collector current can be increased. Moreover, alternatively, as shown in FIG. 6, the base electrode 107 may be configured to be directly connected to a base operation region 118 which is interposed between the emitter 102 and collector 104.

In the lateral bipolar thin-film transistor formed on the insulating substrate, the cross-sectional area of the junction between the base and emitter and the cross-sectional area of the junction between the collector and the base are small, and accordingly the junction capacitance is small. Therefore, this transistor is suited to high-frequency operations.

On the other hand, the demerit of this transistor is that since the cross-sectional area of the emitter is small, a large current, as in an ordinary vertical-type bipolar transistor, cannot be obtained. The driving current itself is smaller than that of the MOS transistor formed on the same Si thin film. Thus, the feature of a high current driving performance, which is conventionally recognized as the merit of the bipolar transistor, does not apply to the present device. Rather, the present device is suited to a small-current, high-speed operation. This feature is advantageous for, e.g. an input/output interface of a display, or a pre-amplifier for current sensing.

Figure 7:
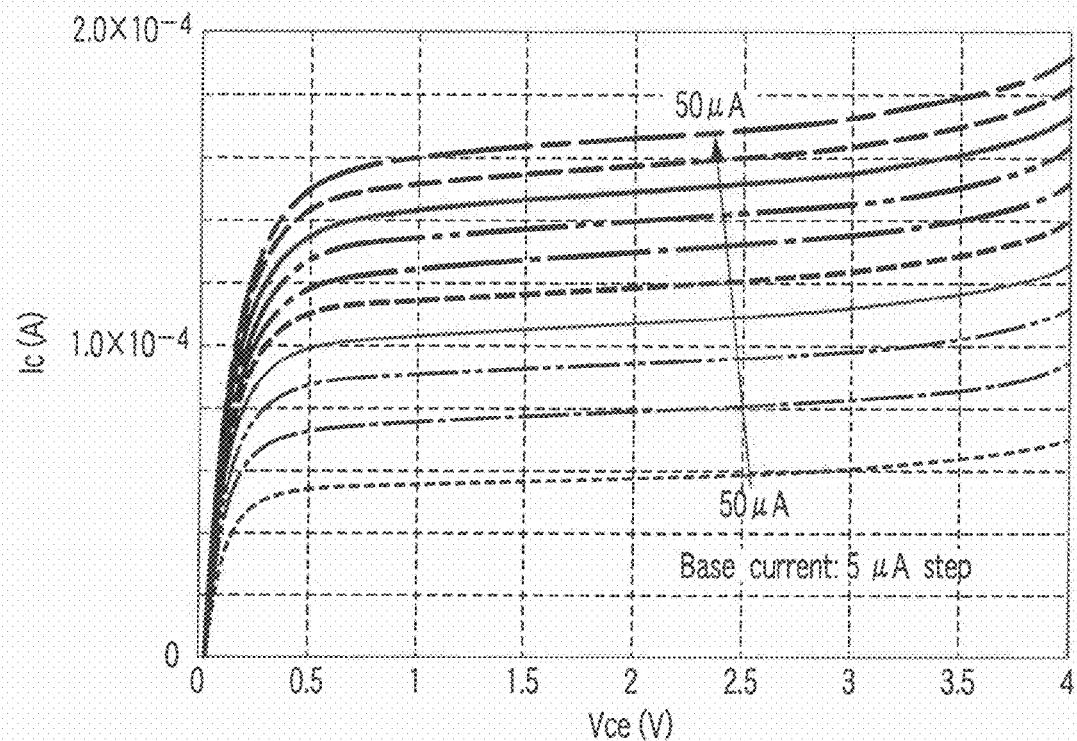
FIG. 7 is a graph showing input/output characteristics of the thin-film transistor according to the first embodiment of the invention.
Figure 8:
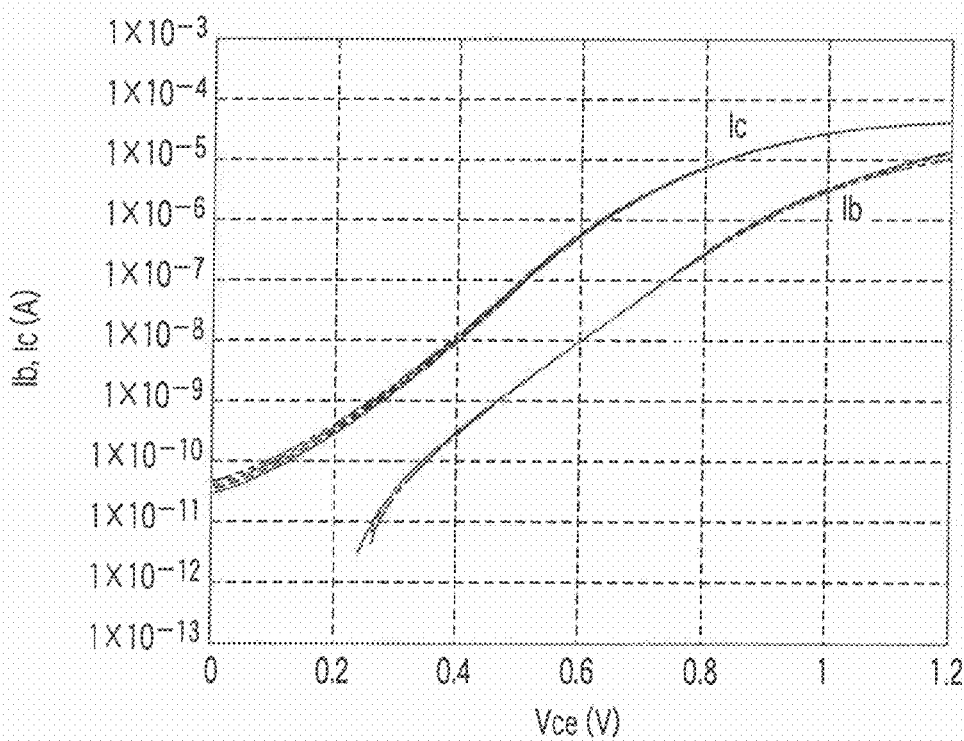
FIG. 8 is a graph showing Gummel plots of the thin-film transistor according to the first embodiment of the invention.

FIG. 7 is a graph showing input/output characteristics of the lateral bipolar thin-film transistor 100 according to the first embodiment shown in FIG. 1 to FIG. 3. In FIG. 7, the abscissa indicates an emitter-collector voltage, and the ordinate indicates a collector current. FIG. 7 shows a measurement result that was obtained by increasing the base current in steps of 5 μA. FIG. 8 is a graph showing Gummel plots. In FIG. 8, the abscissa indicates a base-emitter voltage, and the ordinate indicates a base current and a collector current. It is understood from FIG. 7 that a current amplification factor of 10 or more, for example, is obtained with an output current of 0.01 mA. It is also understood that good saturation characteristics are obtained, which are desirably applied to analog circuits.

Second Embodiment

Figure 9:
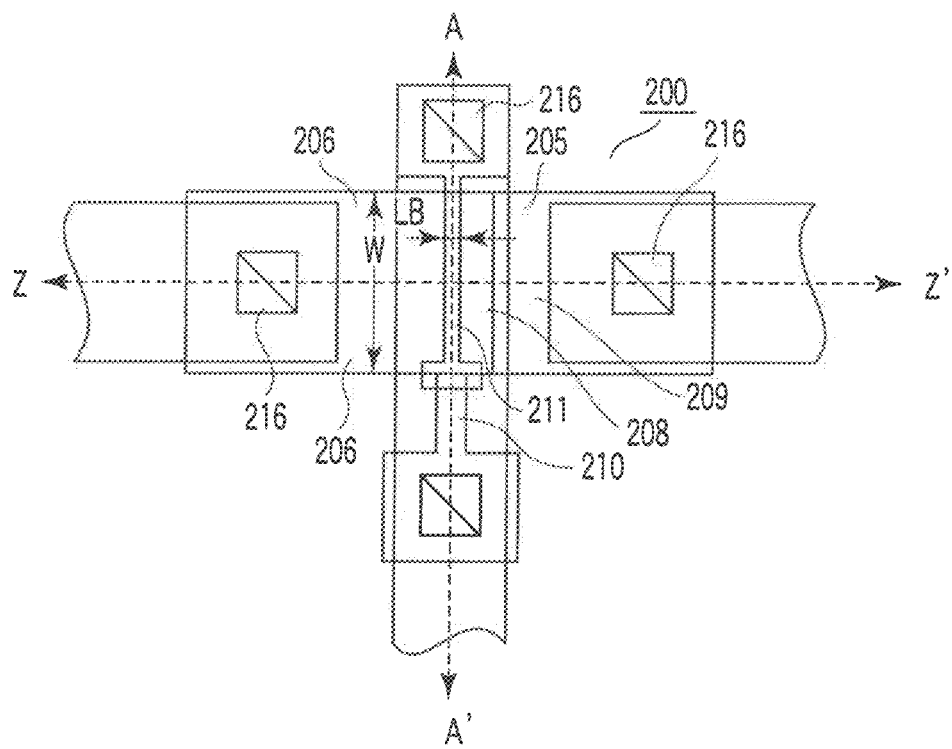
FIG. 9 is a plan view of a thin-film transistor according to a second embodiment of the invention.
Figure 10:
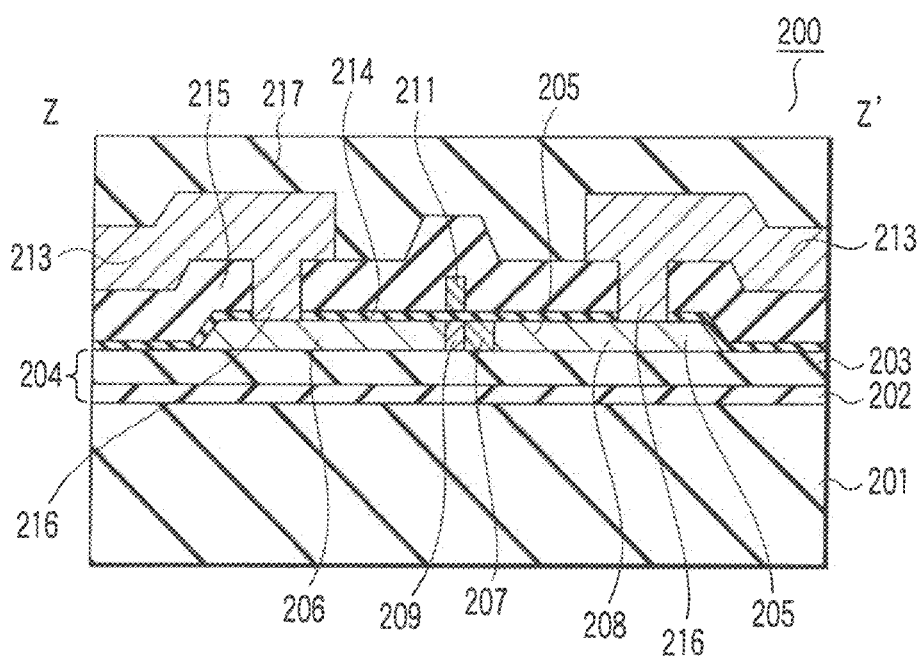
FIG. 10 is a cross-sectional view, taken along line Z-Z' in FIG. 9, showing the thin-film transistor of FIG. 9.
Figure 11:
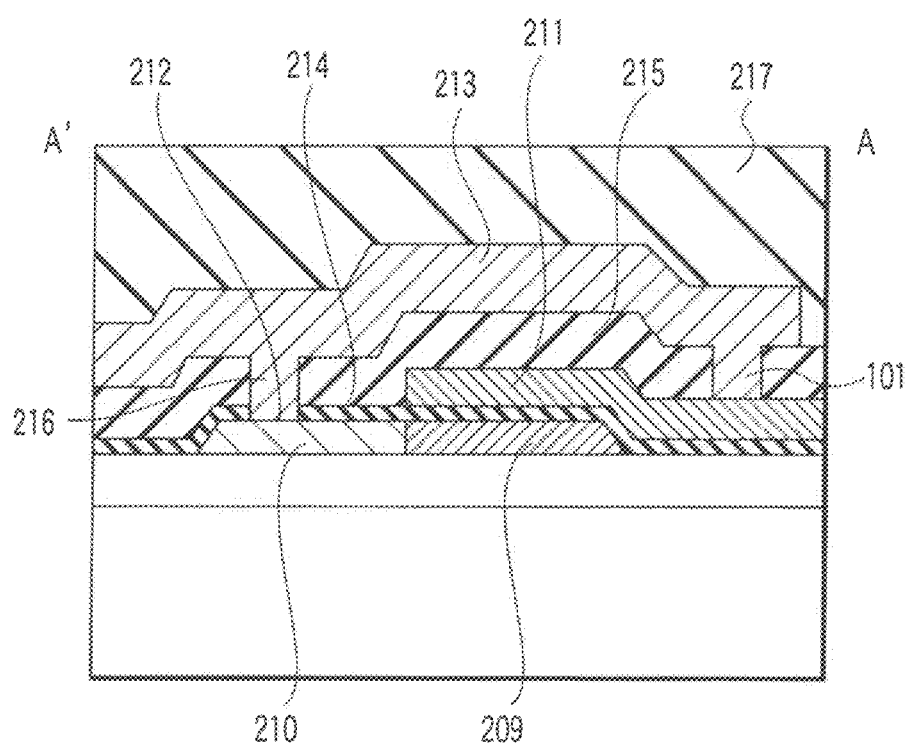
FIG. 11 is a cross-sectional view, taken along line A-A' in FIG. 9, showing the thin-film transistor of FIG. 9.

FIG. 9 is a plan view of a MOS-bipolar hybrid thin-film transistor 200 formed on a glass substrate, according to a second embodiment of the present invention. FIG. 10 is a cross-sectional view taken along line Z-Z' in FIG. 9. FIG. 11 is a cross-sectional view taken along line A-A' in FIG. 9. The MOS-bipolar hybrid thin-film transistor is a transistor having functions of both the MOS transistor and bipolar transistor. The source of the MOS transistor also functions as the emitter of the bipolar transistor. The channel of the MOS transistor also functions as the base of the bipolar transistor. The drain of the MOS transistor also functions as the collector of the bipolar transistor.

The entirety of the MOS-bipolar hybrid transistor 200 is formed on a buffer insulation film 204. The buffer insulation film 111 comprises an SiNx film 202 with a thickness of, e.g. 50 nm and an $SiO_2$ film 203 with a thickness of, e.g. 100 nm, which are formed on a non-alkali glass substrate 201. The substrate that is usable is not limited to the non-alkali glass substrate, and, for example, a quartz substrate, a plastic substrate, or a silicon substrate having an $SiO_2$ film on its surface may be used. The buffer insulation film 204 functions to prevent diffusion of impurities from the glass substrate 201. The structure of the buffer insulation film 204 is not limited to this example. For example, the buffer insulation film 204 may be formed of an $SiO_2$ film alone, or an SiNx film alone. Depending on cases, a semiconductor thin film 205 may directly be formed on the insulating substrate such as glass substrate 201.

Like the first embodiment, a semiconductor thin film 205, e.g. an Si film, which has a substantially T-shape with a thickness of 200 nm, is formed on the $SiO_2$ film 203 as an example of a film that constitutes the transistor (see 112 in FIG. 4). In this embodiment, as this Si film, an Si film including a single-crystal grain with a length of several μ or more is used, the Si film being formed by a lateral crystal growth method using a laser, as will be described later. An $N^+$ doped emitter (source) 206, $N^-$ doped collector (part of a drain) 207, $N^+$ doped collector contact (part of a drain) 208, $P^-$ doped base (channel) 209 and $P^+$ doped base (channel) contact 210 are formed in the semiconductor thin film 205. The device of this embodiment differs from the device of the first embodiment in that a gate electrode 211, which is formed of an MoW alloy film, is formed on the base via a gate insulation film 214 which is formed of $SiO_2$ with a thickness of 30 nm. The above description relates to an NPN transistor (N-channel MOS thin-film transistor). However, a PNP transistor (P-channel MOS thin-film transistor) can similarly be constructed.

Electrode wiring lines 213, which are formed of three-layer metal films of, e.g. Ti/Al/Ti, are connected to the upper surfaces of the Si film 205 and gate electrode 211 via contact through-holes 216 which are formed in a first interlayer insulation film 215. As is understood from the cross-sectional view of FIG. 11 taken along line A-A', the gate electrode 211 and base (channel) contact 212 are connected by the electrode wiring pattern 213, i.e. the pattern of the three-layer metal film of Ti/Al/Ti in this embodiment, so that their potentials are equalized. A second interlayer insulation film 217, which is formed of, e.g. an $SiO_2$ film, is formed so as to cover the entirety of the above-described parts.

In this embodiment, the width W of the base region 103 is 2.5 μm and the length (equal to the distance between the emitter and collector) LB is 1 μm, although the width W and length LB are not limited to these values.

Like the first embodiment, the emitter (source) 206 is doped with phosphorus, the base (channel) 209 is doped with boron and the collector (drain) 207, 208 is doped with phosphorus. The dopants are not limited to the above-mentioned materials. These selective impurity doping processes can be carried out by using ion implantation techniques in ordinary semiconductor fabrication technologies.

The above-described MOS-bipolar hybrid thin-film transistor 200 can be formed on the same insulating substrate, e.g. a non-alkali glass substrate, as the lateral bipolar thin-film transistor of the first embodiment. In this case, the single crystal formation of the semiconductor thin films, in which these transistors are formed, can be carried out in the same crystallization step.

Figure 12:
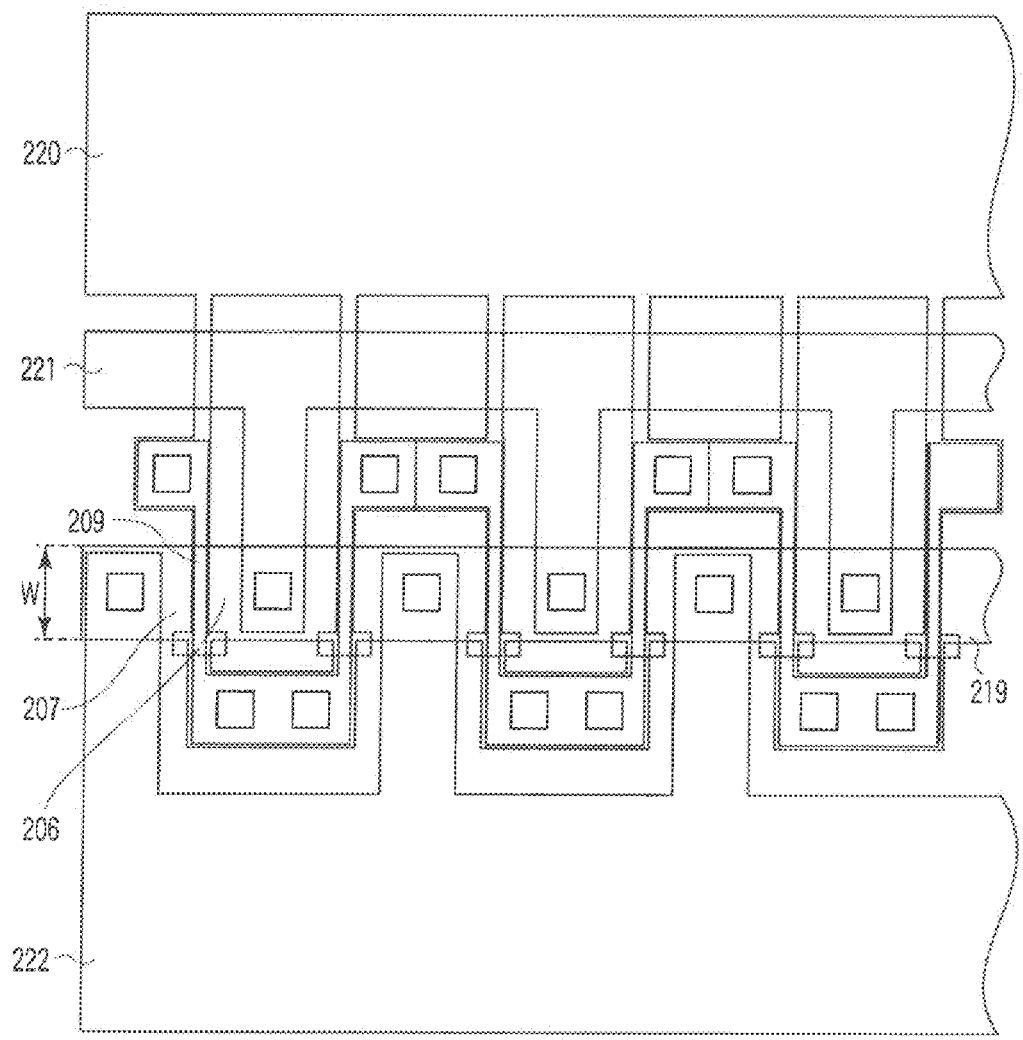
FIG. 12 is a plan view showing a part of a transistor device with a base width of 100 μm, in which 20 thin-film transistors according to the second embodiment of the invention are connected in parallel.

FIG. 12 is a plan view showing a part of a hybrid thin-film transistor with a base (channel) width W of 100 μm as a whole, in which 20 hybrid thin-film transistors (the base (channel) width W is 5 μm in this example) shown in FIGS. 9 to 11 are connected in parallel. A plurality of emitters (sources) 206 and collectors (drains) 207 are formed between a plurality of associated bases (channels) 209 which are formed with intervals on an Si pattern 219. The bases (gate electrodes) 209, emitters (sources) and collectors (drains) are connected to a common gate (base) electrode 220, a common emitter (source) electrode 221 and a common collector (drain) electrode 222, respectively.

As has been described above, in the case of the device with the side-surface contact, the base (channel) width is restricted. Thus, in a transistor that drives a large current, good characteristics can be maintained by arranging a plurality of transistors each with small width W in parallel. This structure can prevent self-heating effects of the device at a time of a large current operation.

In the operation of the present device, like the ordinary bipolar transistor, a current between the emitter (source) and collector (drain) is controlled by flowing a base current between the base (gate) 209 and emitter (source) 206, while applying a positive voltage to the collector (drain) 208. Since the gate electrode 211 and base (channel) contact 212 are connected, a voltage of 1 to 2 V, which is applied between the base and emitter, becomes a gate-source voltage. If this voltage is higher than a threshold voltage Vt of the MOS transistor, a surface channel is formed in the channel region 209, and a surface current flows. Electrons, which are injected from the emitter (source) 206 to the base (channel) 209 by the bipolar operation, flow through the surface channel. Thus, a greater driving current is obtained with this device than in the case of the operation with the bipolar device alone or MOS device alone.

Figure 13:
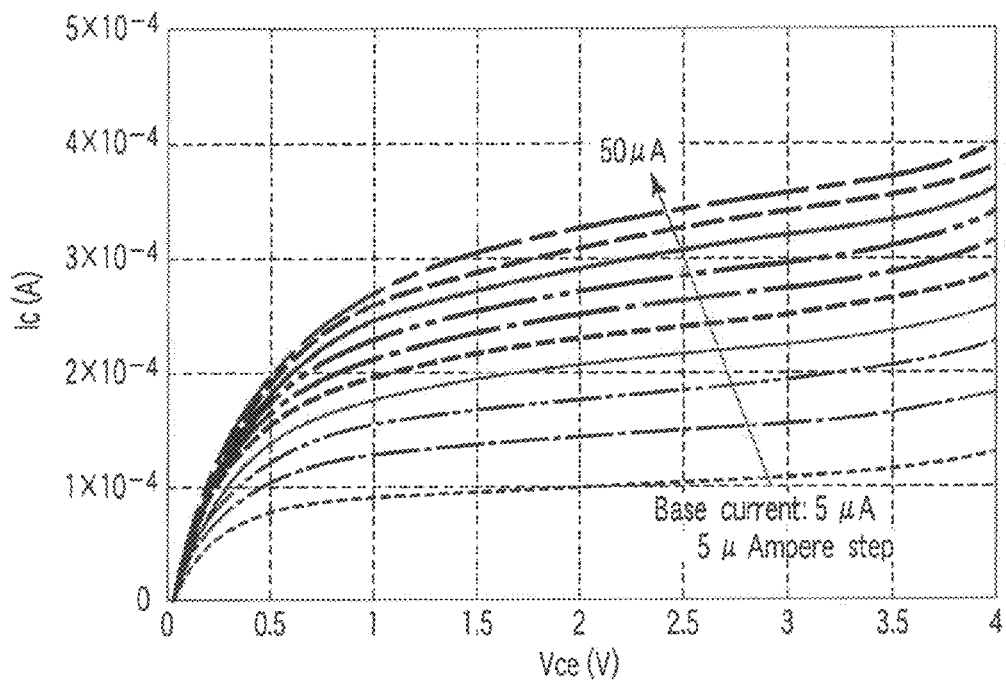
FIG. 13 is a graph showing input/output characteristics of the thin-film transistor according to the second embodiment of the invention.
Figure 14:
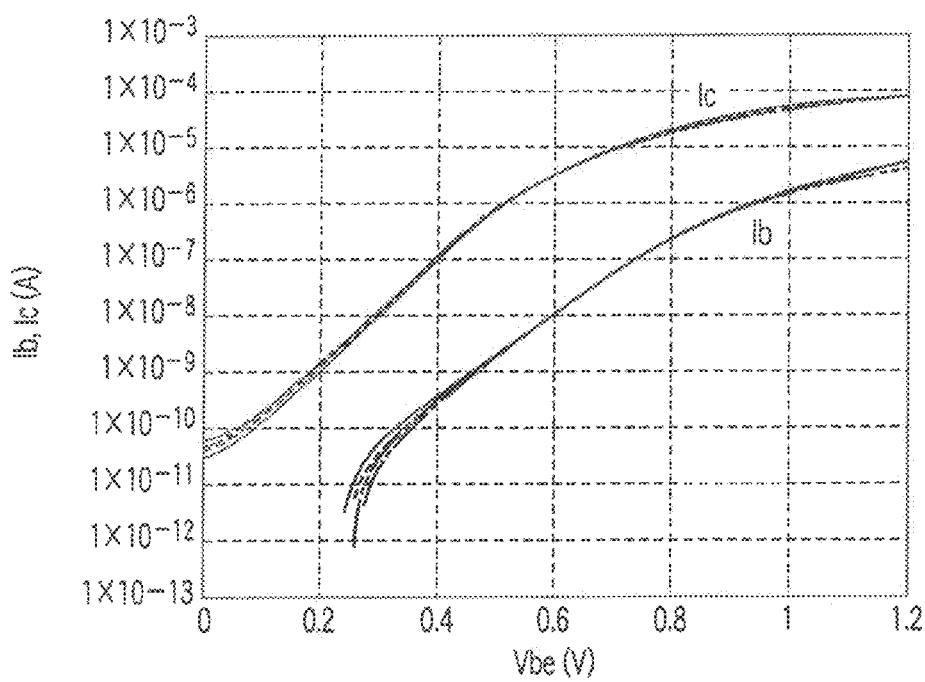
FIG. 14 is a graph showing Gummel plots of the thin-film transistor according to the second embodiment of the invention.

FIG. 13 and FIG. 14 show input/output characteristics and Gummel plots of the above-described hybrid TFT. A higher driving current can be obtained than with the lateral bipolar thin-film transistor 100 shown in FIG. 7 and FIG. 8. In addition, it is understood that the current amplification factor hFE is higher. It was understood that the current value shown in FIG. 13 is about double the current at the time of the operation of the MOS device alone without connection of the base electrode.

FIG. 15 shows the relationship between the collector (drain) current and the current amplification factor hFE of the hybrid TFT 200 according to the second embodiment. A maximum current amplification factor hFE of about 500 is obtained. Thus, a high current gain is obtained by the hybrid operation.

FIG. 16 shows the relationship between the field-effect mobility at the time of the operation in the MOS mode and the current amplification factor at the time of the operation in the bipolar mode in the hybrid TFT 200 in which the film quality of the Si film 205 was varied. The field-effect mobility and the current amplification factor are substantially proportional. For example, in order to obtain a high current amplification factor hFE of 10 or more, it is necessary to use an Si film with such a high quality that the surface channel mobility of 350 (cm$^2$/V•s) is obtained. It is thus proper to use a crystallized Si film.

Figure 17:
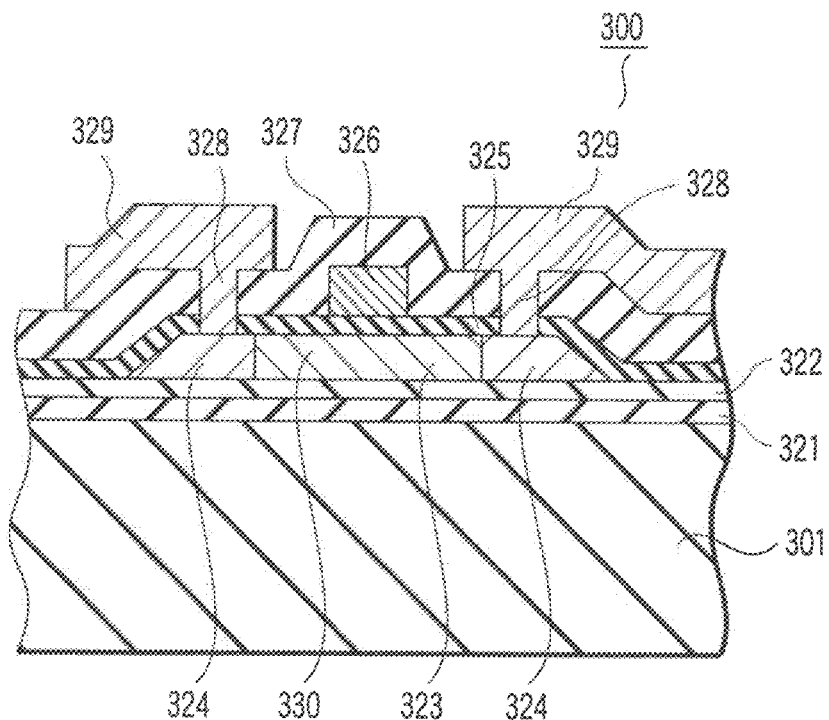
FIG. 17 is a cross-sectional view of a MOS thin-film transistor which can be formed together with the transistor according to the first or second embodiment of the invention.
Figure 18:
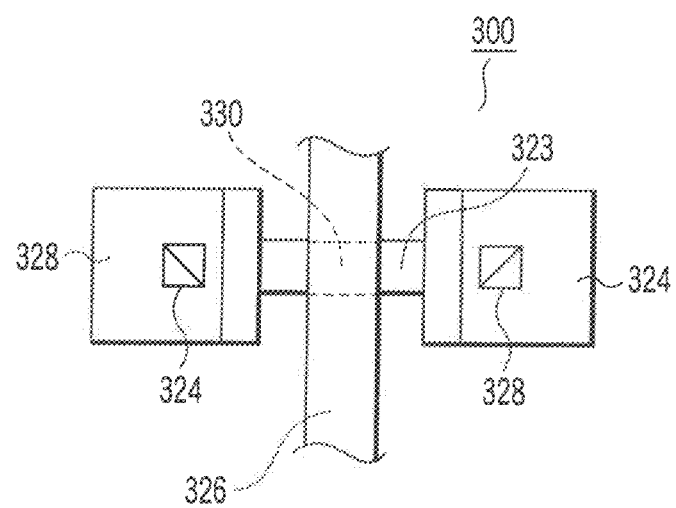
FIG. 18 is a plan view of the MOS thin-film transistor shown in FIG. 17.

FIG. 17 and FIG. 18 are a cross-sectional view and a plan view showing a MOS-type TFT 300 which can be formed at the same time on the same substrate as the above-described bipolar TFT 100 or hybrid TFT 200. The entirety of the MOS-type TFT 300 is formed on a buffer insulation film, which comprises an SiNx film 321 with a thickness of, e.g. 50 nm and an SiO$_2$ film 322 with a thickness of, e.g. 100 nm, which are formed on a non-alkali glass substrate 301.

Like the ordinary field-effect transistor, the MOS-type TFT 300 can be formed as a P-type transistor or an N-type transistor having a source/drain 324 and a channel 330 by properly selecting impurities to be doped. A gate insulation film 325, which is formed of SiO$_2$ with a thickness of, e.g. 30 nm, is formed on a silicon single-crystal region 323 that is formed, for example, by crystallizing an amorphous Si film in a predetermined direction. A gate electrode 326 of, e.g. an MoW alloy film, which extends across the single-crystal region 323, is formed on the surface of the gate insulation film 325. The channel length is determined by the width of the gate electrode 326. An interlayer insulation film 327 of, e.g. SiO$_2$ is formed so as to cover the entirety of the above-described parts. Electrode wiring lines 329, which are formed of three-layer metal films of, e.g. Ti/Al/Ti, are formed via contact through-holes 328 which are formed in an interlayer insulation film 327. The metal film may be formed of various electrically conductive materials, aside from Ti/Al/Ti.

Formation of the Semiconductor Thin Film

The control for image display using, e.g. a liquid crystal panel, can be executed by using thin-film transistors which use an amorphous silicon thin film that is formed on a substrate, e.g. a lass substrate, which is used in fabrication of ordinary thin-film transistors. In general, the amorphous silicon thin film is used after it is annealed. However, it is particularly effective to use, as a display substrate, a substrate having a plurality of insular regions which are formed in an array and are substantially formed of a single crystal thin film, as will be described later. The reason for this is that a plurality of regions which are "substantially" formed of a single crystal thin film can be obtained in a uniform condition in the entire substrate of a large area that is required by a display device. The word "substantially" in this context means that in some cases the plurality of regions may be formed of a plurality of single regions when crystal growth is performed by the method of the invention to be described below, although the plurality of regions should preferably be formed of a perfect single-crystal thin film.

FIG. 19 is an electron microscope image of a substrate 400 which is used in the present invention. A substrate having a plurality of regions formed of arrayed single-crystal thin films is not limited to a glass substrate. In this embodiment, however, a transparent non-alkali glass substrate 101, 201 is used. This substrate for display has such a structure that a plurality of regions formed of, e.g. silicon thin films each with a size of about 5 μm×5 μm, which are arrayed in a two-dimensional matrix, are arranged at intervals of 5 μm in vertical and horizontal directions.

In FIG. 19, poly-crystal regions 402 are present at boundary portions surrounding each single-crystal region 401, and many crystal grain boundaries 403 are present. In the crystal grain boundaries 403, there are electrically active defects functioning as centers of generation/re-coupling of carriers. Thus, the poly-crystal regions 402 are excluded from the formation regions of the base or channel region of the thin-film transistor.

FIG. 20 is an enlarged view of a region A which is one of single-crystal regions in FIG. 19. In the region with a dimension of 5 μm, a peripheral region of about 0.5 μm is a poly-crystal region 402, and there are many defects which occur in crystal boundaries. Thus, the base (channel) region of the transistor is disposed so as not to include the defective region 402 of about 0.5 μm.

The method of fabricating the substrate having crystallized semiconductor thin films is described in detail in Japanese Patent Application No. 2003-209598 that was filed on Aug. 29, 2003 by the applicant of the present application.

A description will now be given of an example of a method of forming a thin-film array having substantially rectangular single-crystal regions each with a dimension of each side of about 4 μm, which are arranged with a pitch of 5 μm, as shown in FIG. 19 and FIG. 20.

In the case where a substrate which is used as a display substrate is a glass substrate, high temperatures as in a case of fabricating a silicon wafer cannot be used in order to obtain a single crystal. To begin with, an amorphous silicon thin film, for instance, is formed on a glass substrate by an arbitrary method. Then, a pulse-like ultraviolet laser beam is applied to the amorphous silicon thin film, thereby melting the amorphous silicon film. The molten silicon is recrystallized and a silicon thin-film region, which is partly made into a single crystal, is obtained. In this embodiment, silicon is used, but the usable semiconductor material is not limited to silicon. For instance, a Group III-V semiconductor may be used.

When recrystallization is performed, the following method is adopted in order to obtain a single-crystal region having a largest possible area. The thin film is melted such that a temperature gradient is imparted to each array part. With the temperature gradient being maintained, the temperature of the substrate is lowered and thus the silicon is recrystallized. To achieve this, such a method is adopted that transmissive light with a light intensity distribution of an inverted peak pattern is generated by using a phase shift mask with a proper pattern, thereby imparting a spatial distribution to the light intensity of a laser beam that is radiated to the substrate surface and imparting a lateral (horizontal) temperature gradient to each array part. According to this method, in a non-radiation period after the radiation of the laser beam, the temperatures of the respective parts of the substrate decrease on the basis of the temperature gradient at the time of melting, the solid-liquid interface moves from the lowest-temperature part toward the high-temperature part, and crystal growth occurs in the lateral direction. Thus, from the initially produced polycrystalline portion, crystal growth progresses with a seed of crystal portion that is particularly suited to crystal growth, and a large single-crystal region is formed. In some cases, a plurality of single-crystal regions are formed. Even in this case, the size of the grown crystal is greater than the size of the channel region of an ordinary thin-film transistor. By this method, it becomes possible to obtain an array having a plurality of substantially single-crystal regions 401 each having a substantially rectangular shape with the dimension of each side of about 4 μm.

Next, referring to FIG. 21 and FIG. 22, the recrystallizing step using, e.g. a phase shift mask is described. A phase shift mask 510 shown in FIG. 21 is formed such that a transparent medium, such as a quartz material, is provided with mutually adjacent regions with different thicknesses. At stepped portions (phase shift portions) 510a between these adjacent regions, the incident excimer laser beam is diffracted or interfered. In this manner, a cyclic spatial distribution is imparted to the intensity of the incident laser beam.

The phase shift mask 510 is configured such that the adjacent patterns have opposite phases (with a 180° phase difference). Specifically, alternately arranged regions comprise a first strip region (phase region) 510b with a phase π and a second strip region (phase region) 510c with a phase 0. Each strip region (phase shift line region) has a width of 10 μm in this example. To be more specific, the phase shift mask 510 is fabricated by pattern-etching a rectangular quartz plate with a refractive index of 1.5 so as to have a depth corresponding to a phase π relative to light with a wavelength of 248 nm, that is, a depth of 248 nm. The region that is thinned by etching becomes the first strip region 510b, and the non-etched region becomes the second strip region 510c.

When the phase shift mask 510 with this structure is used, the laser beam that has passed through the thick second phase region 510c delays by 180°, relative to the laser beam that has passed through the thin first phase region 510b. As a result, interference and diffraction occur between the laser beams. A laser beam intensity distribution 530 with an inverted peak pattern, as shown in FIG. 22, is obtained. Specifically, since the adjacent laser beams that have passed through the phase shift regions have opposite phases, a laser beam that has passed through the phase shift portion between the adjacent phase regions has a minimum light intensity, for example, 0. The temperature of the portion with the minimum light intensity decreases to the minimum, and a cyclic temperature distribution 540 is provided on the substrate surface.

When the irradiation of the laser beam is stopped, a lowest-temperature region 241 or a region near the region 241 has a temperature of a melting point or lower, and a great number of polycrystals that are nuclei for semiconductor recrystallization occur in the region. At first, polycrystals are produced in the lowest-temperature region 541. However, while crystals are grown in succession in accordance with the temperature gradient, a crystal portion with a crystal orientation, which is particularly suited to crystal growth, grows. Thus, at each temperature gradient portion 542, a substantially single-crystal region is obtained.

In the above description, the phase shift mask 510 is configured to have mutually parallel, linear phase shift portions, as shown in FIG. 21 and FIG. 22. However, the configuration of the phase shift mask 510 is not limited to this example. For example, the phase shift lines may be crossed at right angles, and the portion with a phase of 0 and the portion with a phase of π may be arranged in a lattice fashion (not shown). In this case, a region at which the light intensity of the lattice is 0 is formed along the phase shift line. Consequently, a crystal seed occurs at an arbitrary position on the phase shift line, and it becomes difficult, in some cases, to control the position and shape of crystal grains.

In order to control the occurrence of a crystal seed, it is desirable that the regions with a light intensity of 0 are distributed at predetermined cycles in dot shapes. In one possible method for this, the phase shift amount of each of perpendicularly crossing phase shift lines is set at less than 180°. In this case, at the position corresponding to each phase shift line, the light intensity decreases but does not completely become 0. However, by properly choosing the shift amount, as described below, the sum of complex transmittance in the vicinity of the intersection of the phase shift lines can be reduced to 0. In this case, the light intensity at the intersection can be reduced to 0.

Figure 23:
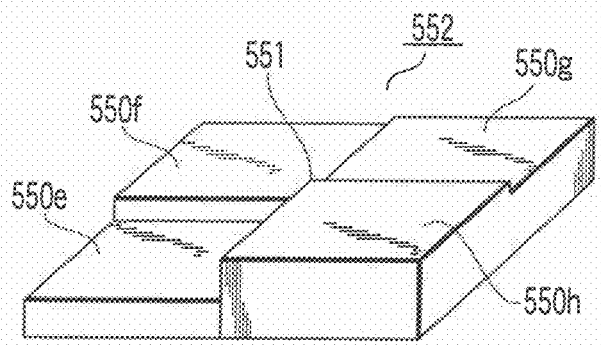
FIG. 23 shows another example of the phase shift mask which is used in order to obtain a single-crystal array in the embodiment of the invention.
Figure 24:
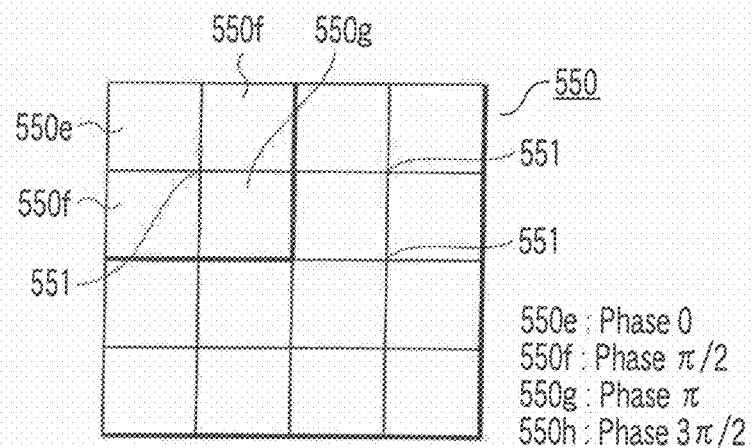
FIG. 24 is a plan view of the phase shift mask shown in FIG. 23.

An example is described referring to FIG. 23 and FIG. 24. A phase shift mask 550 includes a plurality of square patterns 552 each comprising four square regions 550e, 550f, 550g and 550h, which have different thicknesses, as shown in FIG. 23. In each pattern, as shown in FIG. 23, the first region 550e is the thinnest and has a phase 0. The fourth region 550h is the thickest and has a phase that shifts from the phase of the first region 550e by 3π/2. The second and third regions 550f and 550g have thicknesses between the thicknesses of the first and fourth regions 550e and 550h and have phases that shift from the phase of the first region 550e by π/2 and π, respectively.

In the above-described mask, a center point 551 of the square pattern, at which the first to fourth regions neighbor, has an intensity 0. Therefore, this center point becomes a nucleus of crystal growth. In FIG. 23, the center point of the pattern, that is, each lattice point 551, can be set to have the intensity 0. Therefore, the position of occurrence of the crystal grain can easily be controlled. The technique using this kind of phase shift mask is described in the specification of International Application PCT/JP03/03366 which is based on Japanese Patent Application No. 2002-120312 and was filed on Mar. 19, 2003 by the same applicant as the present application.

Third Embodiment

Figure 25:
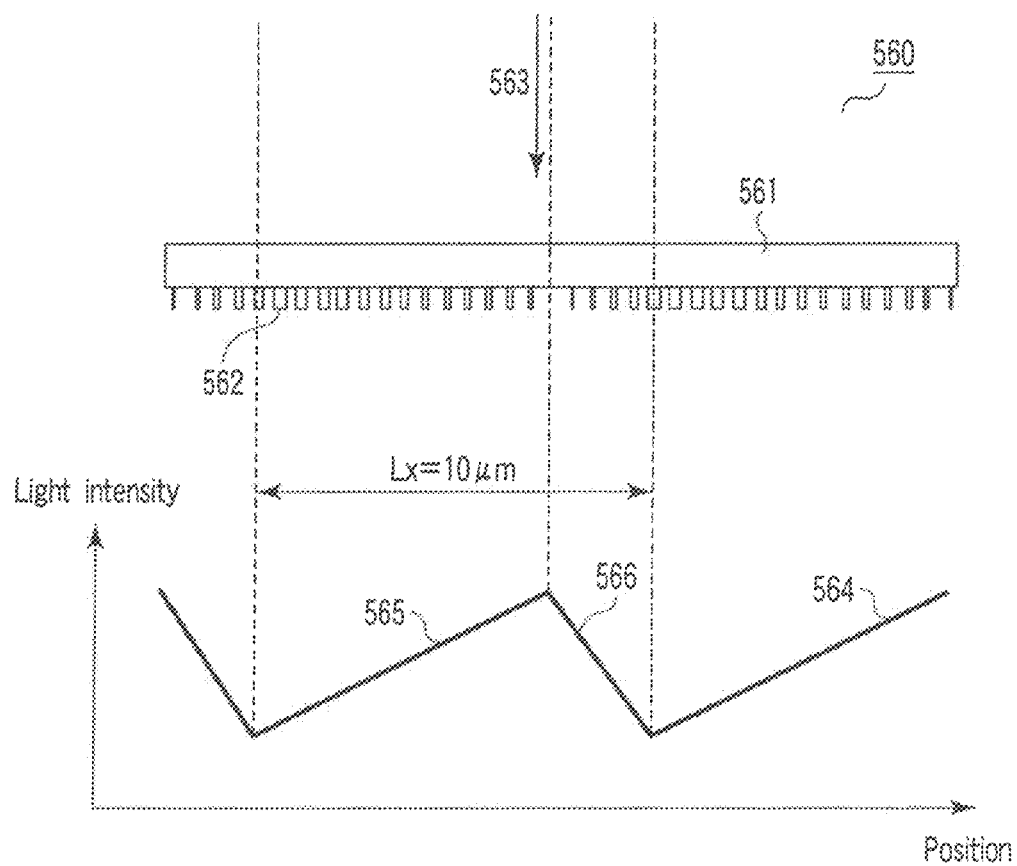
FIG. 25 shows another example of the phase shift mask which is used in order to obtain a single-crystal array in the embodiment of the invention.

FIG. 25 shows a cross section of another phase shift mask 560 which is used in order to obtain a single-crystal Si film, and also schematically shows a light intensity distribution. This phase shift mask 560 is configured such that a plurality of projection patterns 562, which are formed of $SiO_2$ and have predetermined sizes, are arranged on, e.g. a quartz plate 561 with a predetermined density. By passing a spatially homogenized laser beam 563 through the phase shifter 560, a light intensity distribution 564 of a sawtooth repetitive pattern can be provided on an irradiation surface of a multi-layer substrate (not shown).

In this embodiment, the pitch Lx of repetition of projection patterns 562 is set at 10 μm, but this value can be set at a desired value by designing. The light intensity distribution 564 shown in FIG. 25 includes sawtooth portions formed of a pair of straight portions 565 and 566 with different inclinations. The light intensity distribution is not limited to the sawtooth distribution, and may be an arbitrary light intensity distribution which is suited to crystallization.

Figure 26:
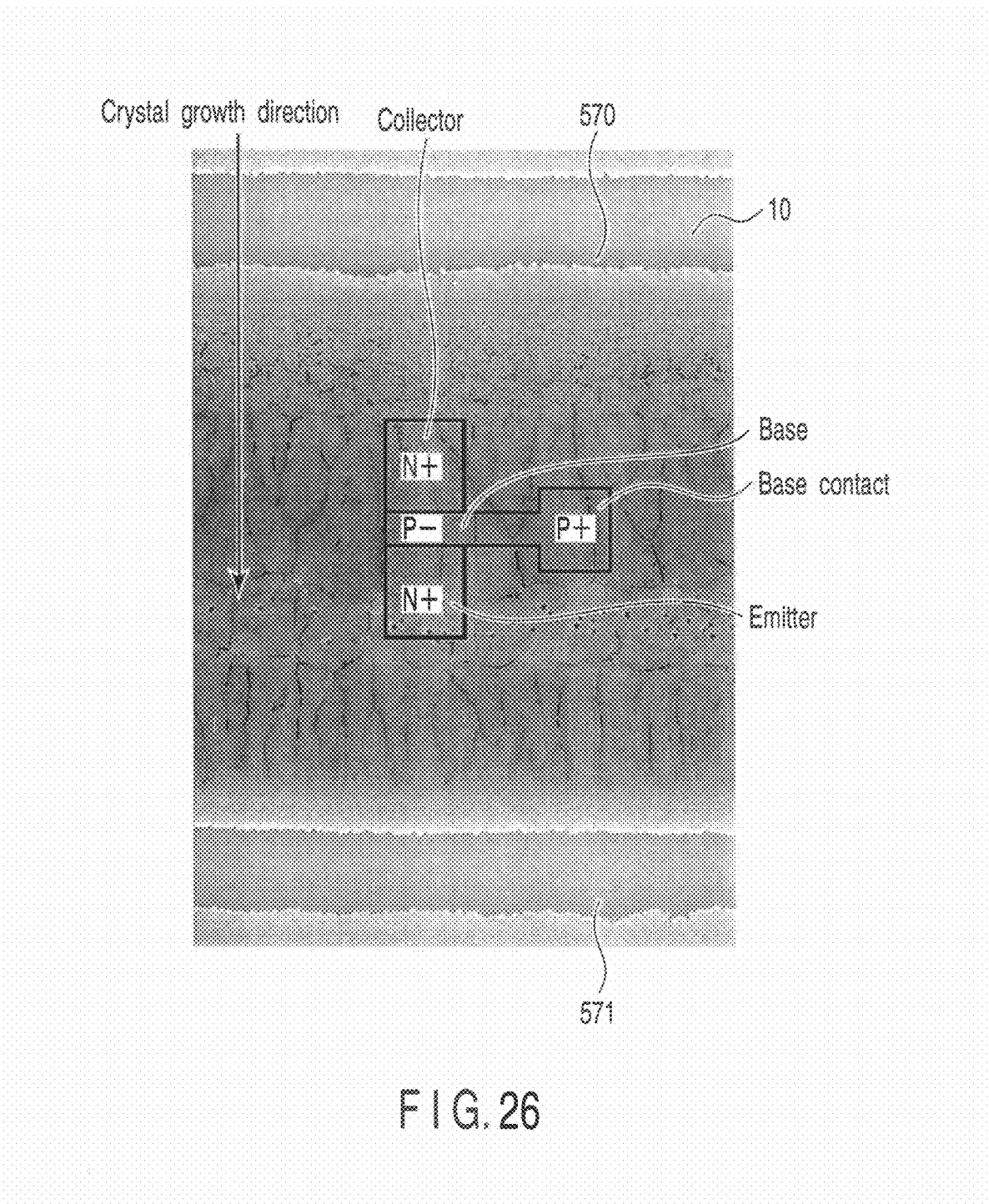
FIG. 26 shows a surface SEM image of a crystallized Si film.

FIG. 26 shows a surface SEM image of a crystallized Si film which is formed according to the invention. The multi-layer substrate is heated by irradiation of a laser beam and the semiconductor film is melted. Then, the irradiation of the laser beam is stopped, and the temperature is let to fall and the semiconductor film is crystallized. At this time, melting/re-crystallization occurs from a region with a low laser intensity toward a region with a high laser intensity (i.e. from an upper region to a lower region in FIG. 26). As a result, a crystallization start portion 570 is in a polycrystalline state, and as crystal growth progresses in the horizontal direction of the substrate, a crystal grain having directivity for easy crystallization becomes gradually larger. Thus, an aggregation of single crystal grains, which is greater in size than a TFT that is to be formed subsequently, can be formed. A poly-crystal is formed in the vicinity of a crystallization termination portion 571 at which crystallization progresses and the crystal collides with a neighboring crystallization region.

FIG. 26 shows a pattern image of a bipolar transistor which is disposed on this film. This transistor is arranged such that the collector-emitter direction, in which a current flows, is parallel to the direction of crystal growth. Thereby, the flow of carriers is not hindered by crystal grain boundaries, and good characteristics are obtained. In this arrangement, the collector is positioned near the crystal growth start point and the emitter is positioned near the crystal growth termination point. Hereinafter, this arrangement is defined as "forward-arrangement". On the other hand, the arrangement in which the positions of the collector and emitter are reversed is defined as "reverse-arrangement".

Figure 27:
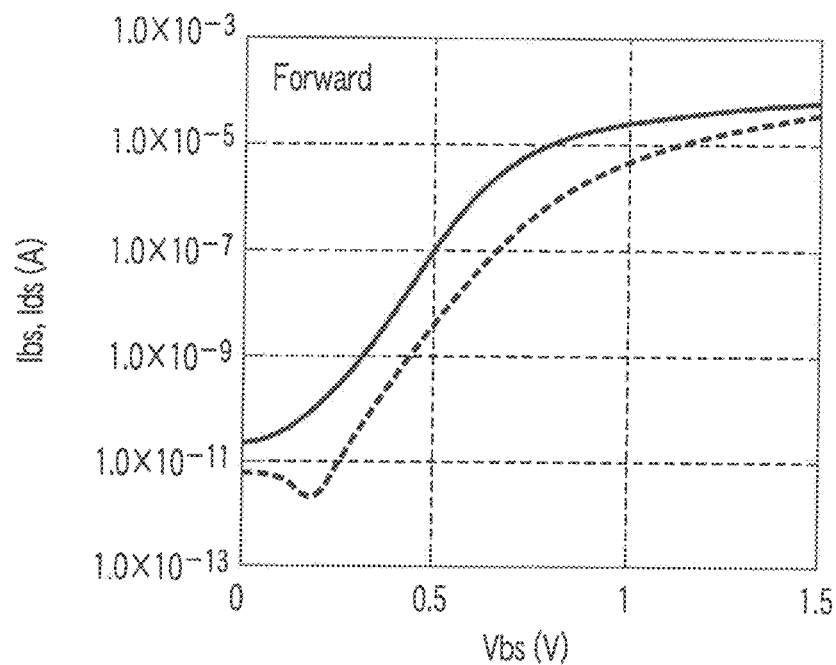
FIG. 27 is a graph showing the base voltage dependency of a current amplification factor β of a bipolar thin-film transistor according to a third embodiment of the invention.
Figure 28:
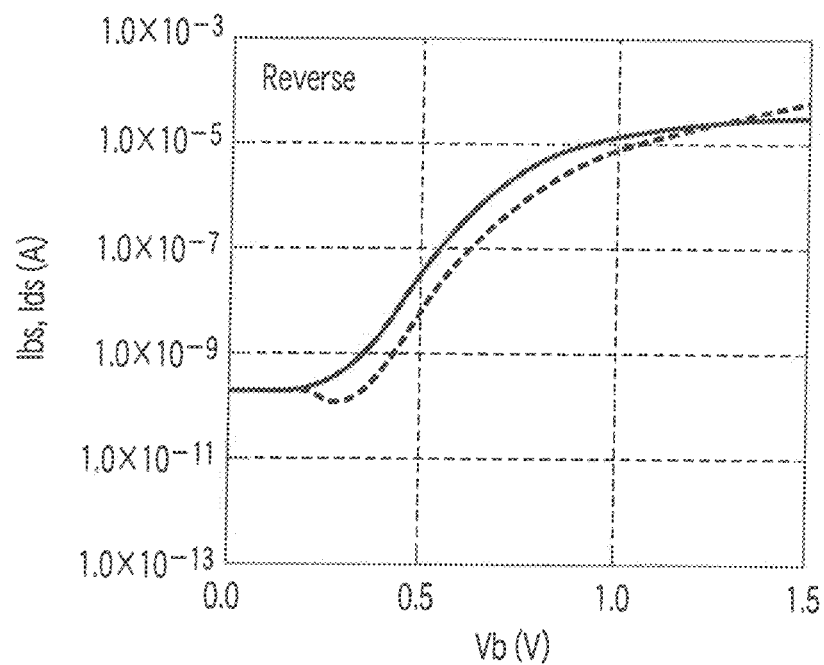
FIG. 28 is a graph showing Gummel plots of the bipolar thin-film transistor according to the third embodiment of the invention.
Figure 29:
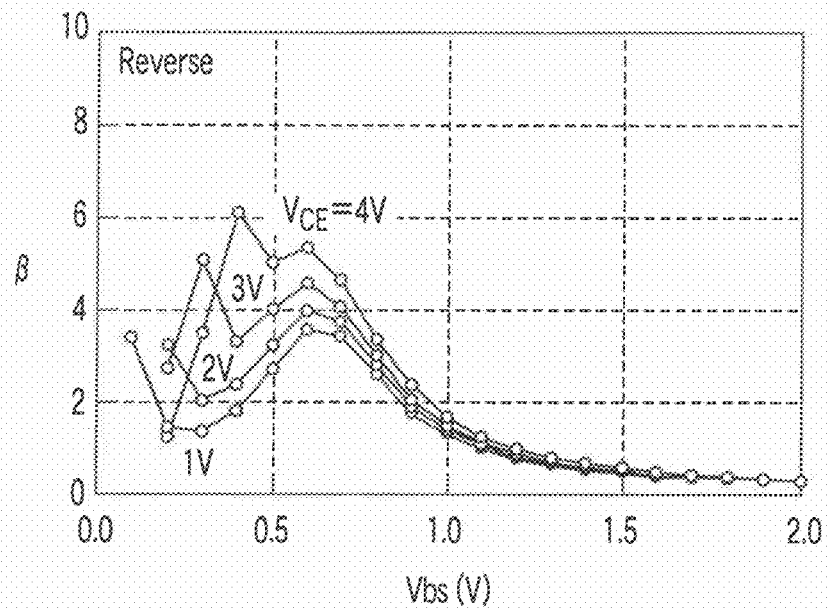
FIG. 29 is a graph showing base-emitter junction and base-collector junction characteristics of a forward-arrangement bipolar thin-film transistor according to the third embodiment of the invention.
Figure 30:
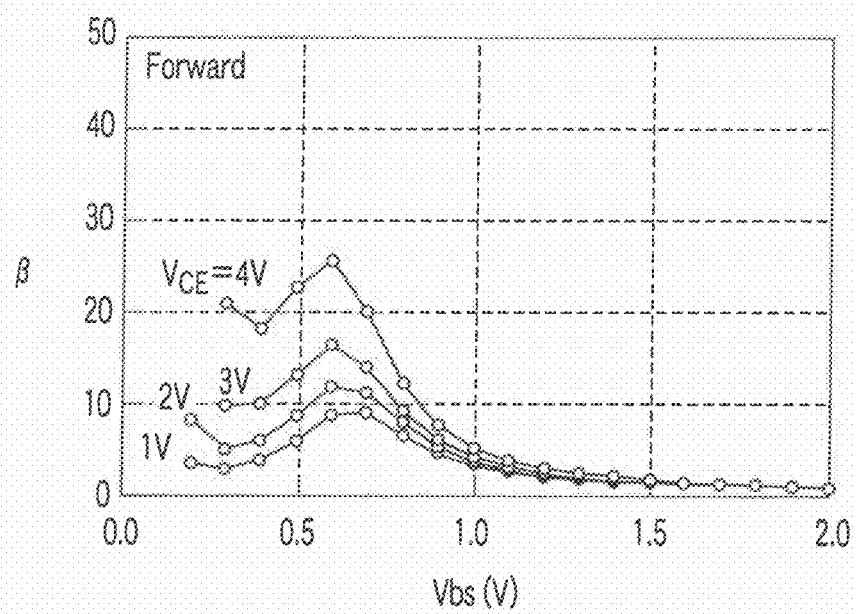
FIG. 30 is a graph showing base-emitter junction and base-collector junction characteristics of a reverse-arrangement bipolar thin-film transistor according to the third embodiment of the invention.

FIG. 27 and FIG. 28 show Gummel plots in the forward-arrangement and reverse-arrangement of the transistor shown in FIG. 26. The current amplification factor is higher in the forward-arrangement (FIG. 27) than in the reverse-arrangement (FIG. 28). FIG. 29 and FIG. 30 are graphs in which the current amplification factor β is plotted relative to the base-emitter voltage Vbs in the forward-arrangement and reverse-arrangement, respectively. In the forward-arrangement, β is near 30, whereas in the reverse-arrangement, β is about 6. From this result, it is preferable to arrange the collector near the crystal growth start point and the emitter near the crystal growth termination point, whereby good transistor characteristics are obtained. It is considered that this asymmetry in characteristics occurs due to a difference in electrical characteristics between the base-collector junction and the base-emitter junction.

FIG. 31 is a graph showing diode characteristics of the base-collector junction and base-emitter junction in the same device. In the case of the base-collector junction, a reverse-directional leak current is greater and also the n value of forward-directional characteristics is greater. It is understood that the density of defects functioning as centers of re-coupling is higher in the base-collector junction. The reason for this appears to be that since the width of the crystal grain increases with the progress of lateral crystal growth, as is understood from the SEM image of FIG. 26, the density of crystal grain boundaries decreases toward the crystal growth termination point. As described above, in the case where the bipolar transistor is formed on a crystal that is grown in one direction, a greater current amplification factor can be obtained by arranging the collector near the crystal growth start point and the emitter near the crystal growth termination point.

Figure 32:
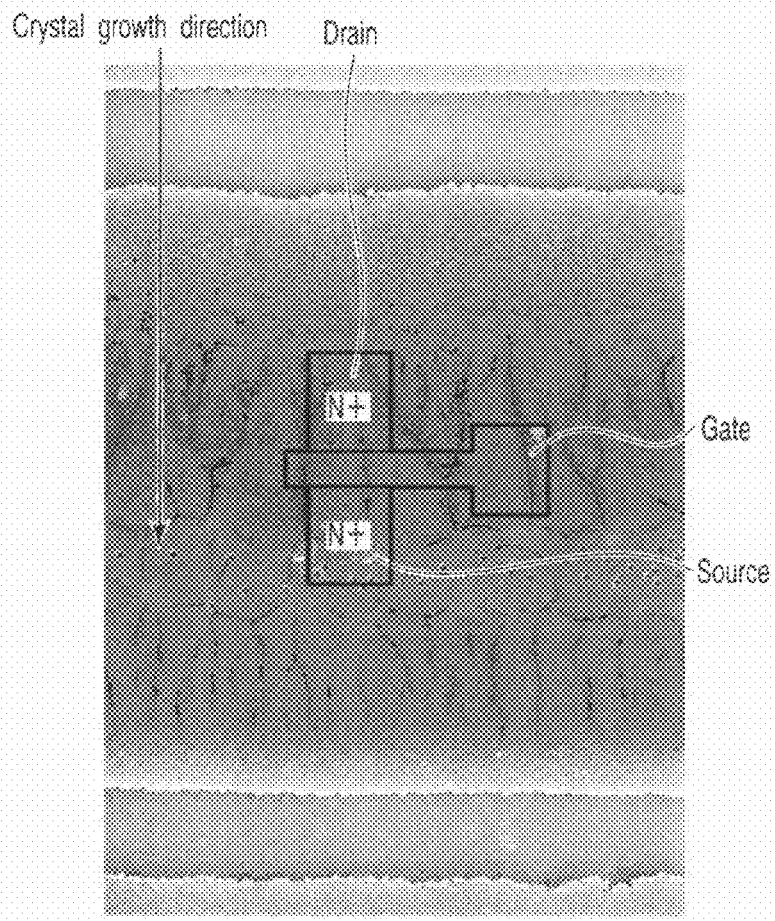
FIG. 32 shows an electron microscopic image of a Si crystal film in the third embodiment of the invention, and a schematic diagram of a MOS thin-film transistor, which is laid over the electron microscopic image.
Figure 33:
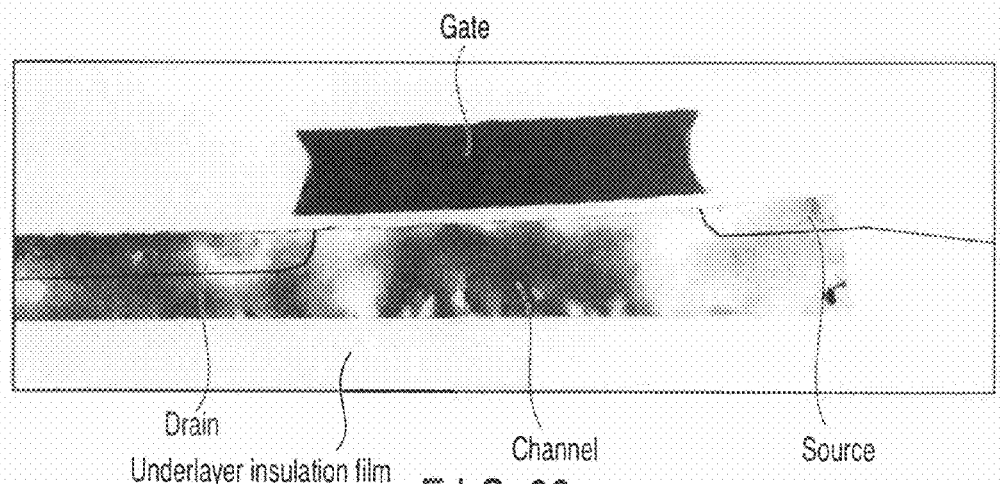
FIG. 33 shows a cross-sectional transmissive electron microscopic image of the MOS thin-film transistor according to the third embodiment of the invention.

FIG. 32 is a schematic plan view of a MOS transistor which is disposed on a crystal having the same structure as shown in FIG. 26. This transistor is arranged such that the source-drain direction, in which a current flows, is parallel to the direction of crystal growth. Thereby, the flow of carriers is not hindered by crystal grain boundaries, and good characteristics are obtained. In this arrangement, the drain is positioned near the crystal growth start point and the source is positioned near the crystal growth termination point. Like the case of the bipolar transistor, this arrangement is defined as "forward-arrangement". On the other hand, the arrangement in which the positions of the drain and source are reversed is defined as "reverse-arrangement". FIG. 33 is a cross-sectional transmissive electron microscopic image of the MOS thin-film transistor that is disposed in this fashion.

Figure 34:
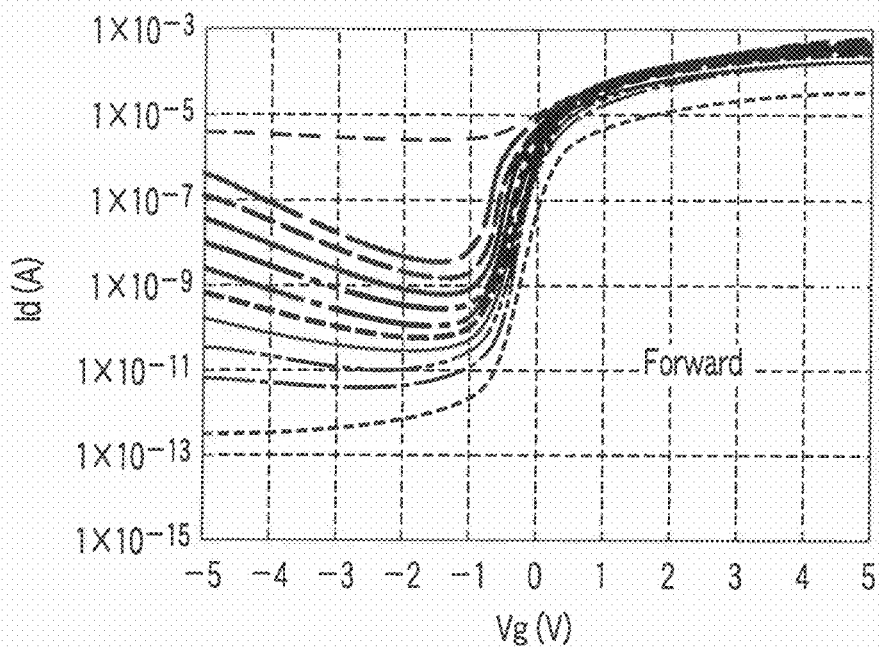
FIG. 34 is a graph showing ID-VG characteristics of a forward-arrangement MOS thin-film transistor according to the third embodiment of the invention.
Figure 35:
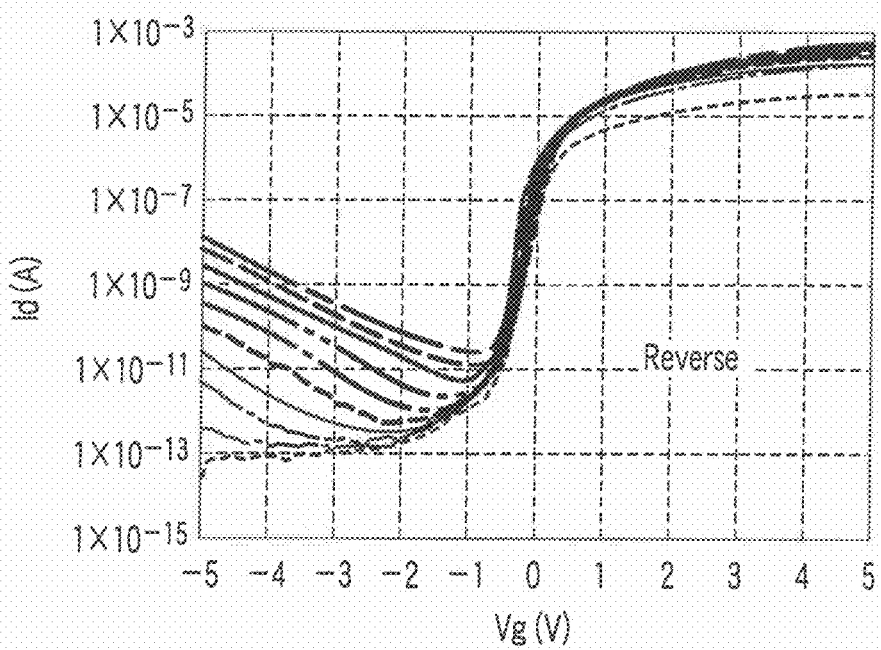
FIG. 35 is a graph showing ID-VG characteristics of a reverse-arrangement MOS thin-film transistor according to the third embodiment of the invention.
Figure 36:
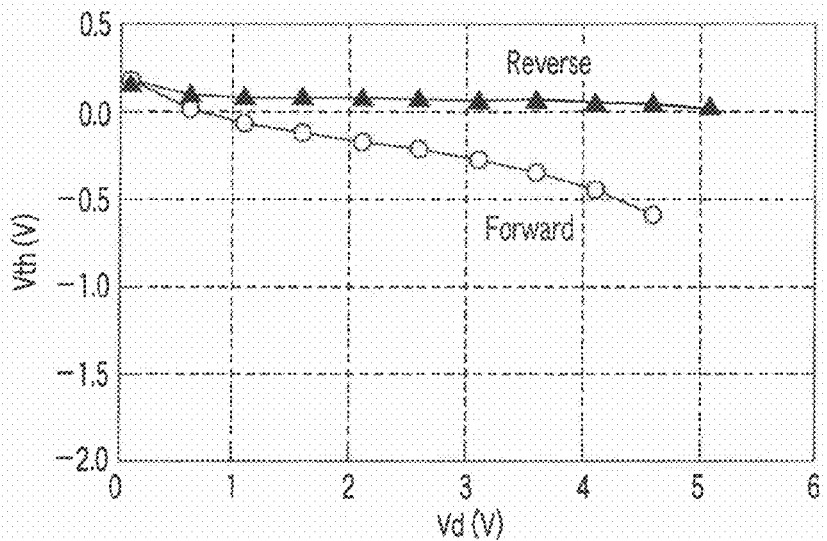
FIG. 36 is a graph showing the drain voltage dependency of a threshold voltage Vth of the MOS thin-film transistor according to the third embodiment of the invention.

FIG. 34 and FIG. 35 show ID-VG characteristics of the thus fabricated MOS transistor, which were measured by varying the source-drain voltage between 0.1 V and 5.1 V in the forward-arrangement and the reverse-arrangement. FIG. 36 shows a result obtained by plotting the threshold voltage Vth of the transistor as a function of the drain voltage on the basis of the results shown in FIG. 34 and FIG. 35.

In the reverse-arrangement, the drain voltage dependency of Vth is low. In the forward-arrangement, the Vth decreases as the drain voltage increases, and the Vth takes a negative value when the drain voltage is 0.5 V or more. It is also understood that the drain voltage dependency of leak current is greater in the forward-arrangement in the region in which the gate voltage is negative.

It is considered that the decrease in Vth results from the potential variation of the body due to a drain-junction leak current. It is considered that the Vth, which gently lowers in the middle-level Vd region in the forward-arrangement, is associated with a body potential variation due to both drain leakage and impact ionization. The difference in degree of decrease in Vth between the forward-arrangement and reverse-arrangement indicates that the intensity of body potential variation differs between the two arrangements.

If the Vth decreases in accordance with the increase in drain voltage, a large punch-through current undesirably flows due to the drain voltage that is actually used in the circuit. It was found by a detailed analysis that this asymmetry of the drain current dependency of Vth occurs due to the leak current at the drain junction and source junction and the asymmetry of current amplification factor β, as shown in FIG. 29, FIG. 30 and FIG. 31. FIG. 29 and FIG. 30 shows the variation of β relative to the Vbs. Attention should be paid to the fact that the β varies about 5 times between the forward-arrangement and the reverse-arrangement. It is considered that since both the leak current at the junction and the bipolar gain are different, the asymmetry occurs in the decrease in Vth in the case where the source and drain are reversed.

From the above result, it is desirable that in the case where the MOS transistor is formed on the crystal that is grown in one direction, the MOS transistor should be formed such that the source is positioned near the crystal growth start point and the drain is positioned near the crystal growth termination point. Thereby, the drain voltage dependency of Vth and the drain leak current can be reduced.

Fourth Embodiment

Figure 37:
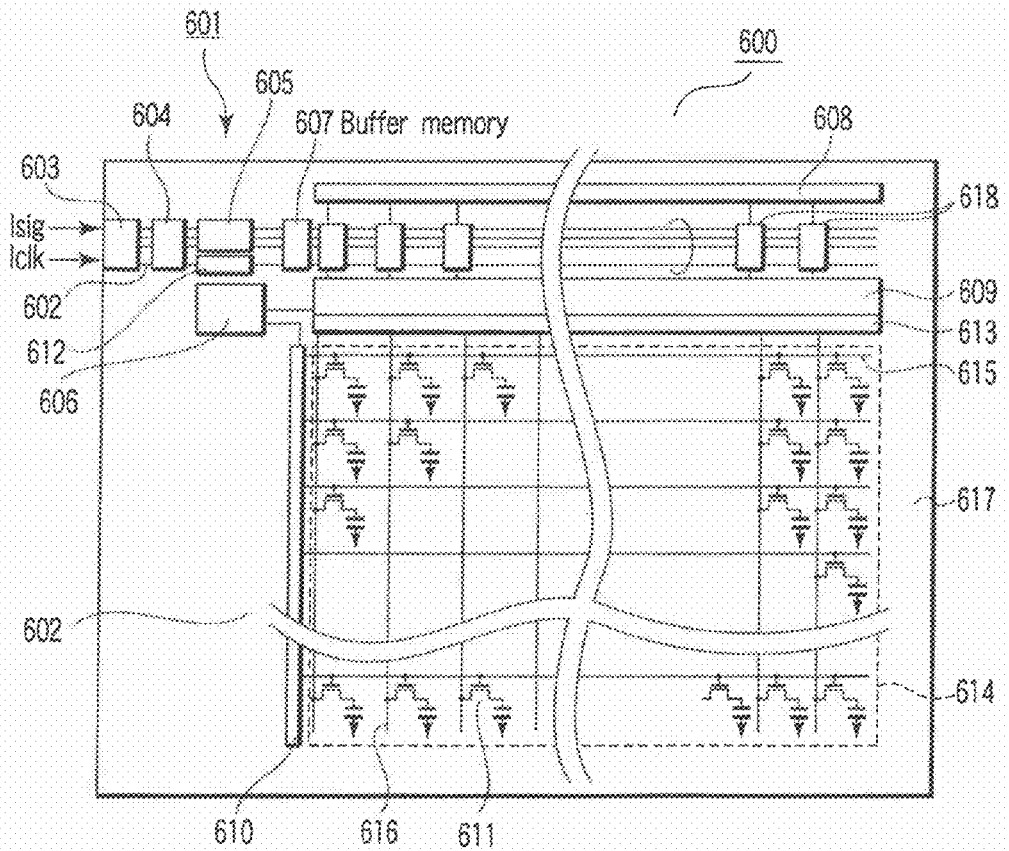
FIG. 37 shows the entire structure of a liquid crystal display device according to a fourth embodiment of the invention.

As has been described above, the lateral bipolar transistor 100 or hybrid transistor 200 formed on the glass substrate, as shown in FIG. 1 or FIG. 9, is different from the ordinary bipolar transistor. These transistors are not used in a circuit that requires a large driving current, but are suited to amplification of a relatively small current. It is thinkable that these transistors are applicable to a current-driving-type serial interface in a display device 600 that makes use of this feature. FIG. 37 shows an example of a front-end circuit 601 of such a current-driving-type interface.

If the resolution and the number of colors of an image increase, the amount of data to be transmitted increases accordingly. However, since the refresh speed of image display is fixed, the clock frequency of a transmission path 602 needs to be increased if the amount of data increases. In this way, if the frequency of the transmission path 602 increases, such a problem arises that unwanted electromagnetic radiation occurs from the transmission path and noise is caused in an external device due to electromagnetic interference (EMI). To solve this problem, a method is adopted in which EMI is reduced by low-voltage differential driving, which is known as, e.g. LVDS (Low Voltage Differential Signaling). An example of this technique is disclosed in, e.g. Jpn. Pat. Appln. KOKAI Publication No. 2002-176350. In addition, in recent years, as a transmission scheme capable of more effectively reducing EMI, there has been proposed a serial interface by current driving. One example is disclosed in Jpn. Pat. Appln. KOKAI Publication No. 2003-76345. In the circuit shown in FIG. 37, it is assumed that a two-value current signal Isig is supplied from the system side. An input interface circuit (IF) 603 is configured to receive the signal Isig and to convert it to a voltage signal. A level shift circuit 604 executes voltage amplification of the voltage signal, and delivers the amplified voltage to a subsequent serial/parallel conversion circuit 605. The feature resides in that a lateral bipolar transistor is used in the input section of the input interface circuit.

Figure 38:
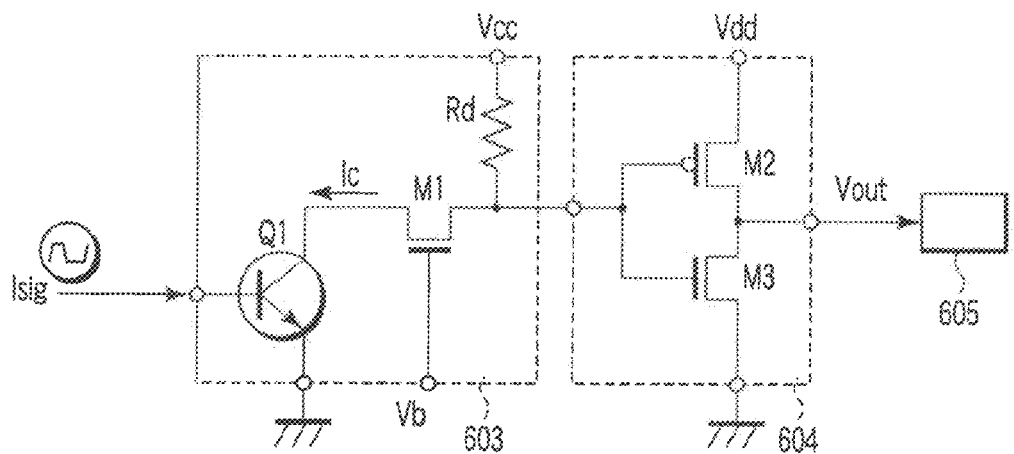
FIG. 38 shows the structure of a signal interface circuit in the fourth embodiment of the invention.

FIG. 38 shows an example of the circuit configurations of the input interface circuit (IF) 603 and level shift circuit 604. The input section is configured such that an emitter-grounded lateral bipolar transistor Q1 and a gate-grounded MOS transistor M1 are cascode-connected. The transistor Q1 amplifies the input signal Isig. The input signal is converted to a voltage signal by the MOS transistor M1 and a load resistor Rd. Then, the voltage signal is input to the level shift circuit 604 which is composed of a CMOS inverter. By using the bipolar transistor Q1 which can directly amplifies the input signal in the input section, the level of the input signal current Isig can be lowered. Thus, the power consumption on the signal transmission system side can be reduced.

Figure 39:
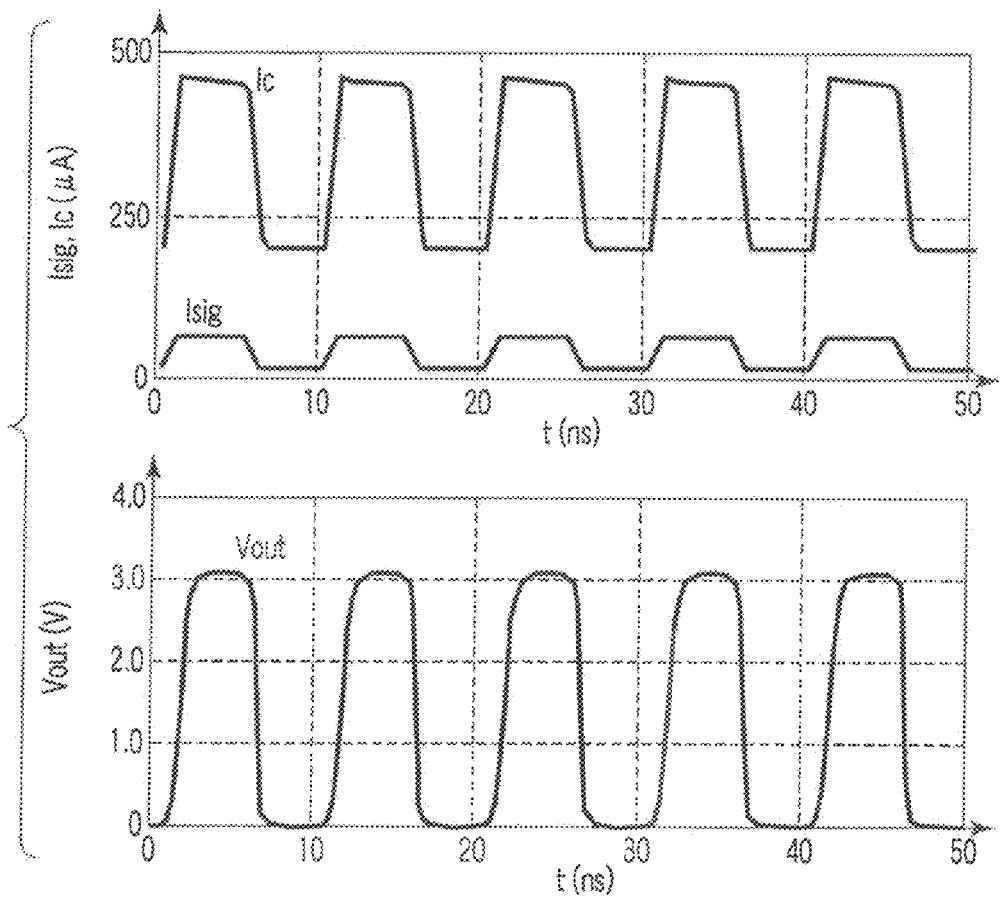
FIG. 39 shows an input current waveform, a collector current waveform and an output voltage waveform of the signal interface circuit in the fourth embodiment of the invention.

FIG. 39 shows signal waveforms of the input current signal Isig, a collector current Ic flowing in the lateral bipolar transistor Q1 and an output voltage Vout of the level shift circuit 604 in the circuit shown in FIG. 38. Since the level of the signal Isig is very low and is 0 to 70 μA, the EMI is minimized. In addition, the current signal of 0 to 70 μA can be converted to a voltage signal of 0 to 3 V by a very simple circuit comprising the four transistors.

In the present embodiment, the cascode-connected circuit of the lateral bipolar transistor and MOS transistor is used in the input interface circuit 603, and the CMOS inverter is used in the level shift circuit 604. However, the circuit configurations are not limited to this example, and an ordinary differential amplifier circuit may be used.

Figure 40:
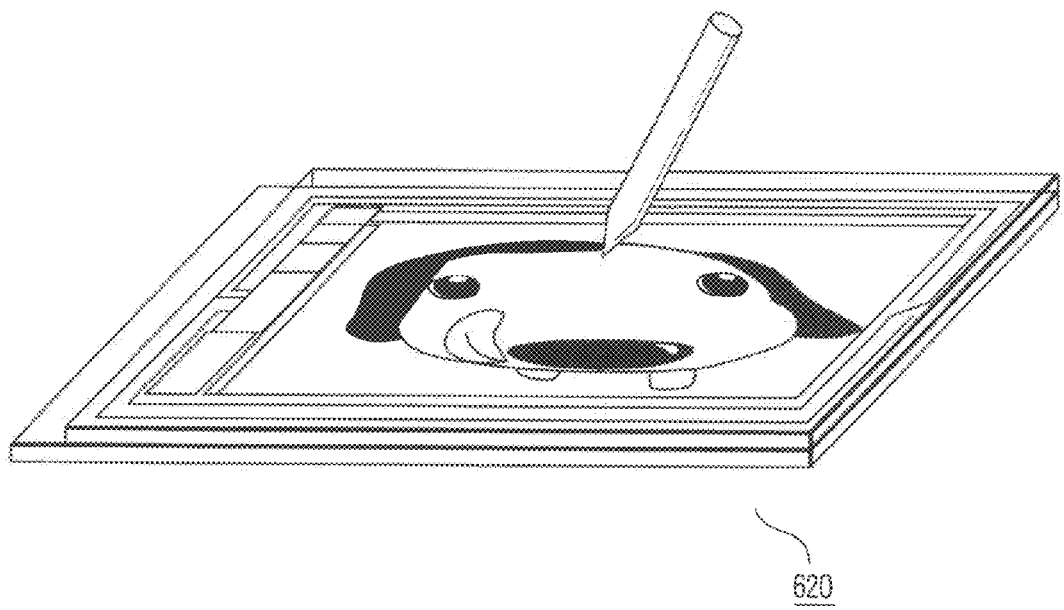
FIG. 40 is a perspective view of a liquid crystal display device according to the fourth embodiment of the invention.

FIG. 40 shows the structure of an entire liquid crystal display device including the interface circuit 603 shown in FIG. 37. The interface circuit 603 receives not only a video signal, but also a clock signal Iclk, a control signal, etc., as current signals, and converts them to voltage signals. The current signals are supplied to the level shift circuit 604 and adjusted to proper voltage levels. The video signal is converted to a parallel signal by the serial/parallel conversion circuit 605. The clock signal Iclk is frequency-divided by a frequency-division circuit 612 in accordance with the degree of parallel conversion, and the frequency-divided signal is delivered to a timing controller 606. The parallel-converted video signal, together with the frequency-divided clock signal, is delivered to a horizontal driver circuit 608 via a buffer memory 607. In the horizontal driver circuit 608, the video signal is latched at a proper timing, and is delivered to a DA conversion circuit 609 which is provided in association with each signal line. The DA conversion circuit 609 converts the video signal to an analog signal and supplies it to the display section. In the display section, a switch transistor 611, which is provided in each pixel, is turned off/off by a scanning signal that is supplied from a vertical scanning circuit 610, and the analog voltage from the horizontal driver circuit is supplied to the liquid crystal layer, and an image is displayed by an active-matrix display unit 614.

Figure 41:
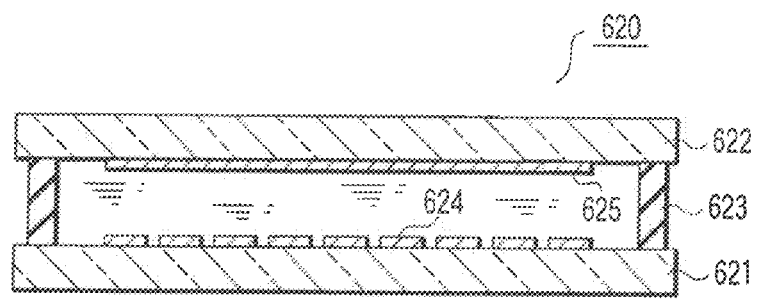
FIG. 41 is a cross-sectional view of the liquid crystal display device according to the fourth embodiment of the invention.

FIG. 40 is a bird's-eye view of an entire liquid crystal display device 620. FIG. 41 is a cross-sectional view of the liquid crystal display device 620. A liquid crystal material 623 is disposed between transparent insulating substrates 621 and 622. A plurality of pixel electrodes 624, which are driven by the active-matrix circuit shown in FIG. 37 and are arrayed in a matrix, are formed on the transparent substrate 621. A counter-electrode 625 is disposed on the transparent insulating substrate 622. The potential of each pixel electrode 624 is controlled by the switch transistor 611 shown in FIG. 37. The optical characteristics of the liquid crystal material 623 are controlled by controlling the potential that is applied to the liquid crystal material 623 disposed between the counter-electrode 625 and the pixel electrodes 624.

By adopting the current-driving-type input interface and using the lateral bipolar transistor Q1 in the input circuit on the display device side, signal transmission is enabled at a lower signal level than in the prior art. Therefore, the EMI and the power consumption of the entire system can be reduced. Moreover, in the present system, the transmission frequency can be increased by virtue of low EMI of the current interface. Therefore, the present system is advantageously applicable to a liquid crystal display device with a high definition and a large number of gray levels.

Furthermore, in the present embodiment, the signal transmission by current driving is applied, by way of example, to the transmission path between the display external system and the display substrate. The present invention, however, is not limited to this example, and the invention is applicable to signal transmission in a circuit block in an active-matrix substrate. For example, in a case where the horizontal driver circuit is composed of a plurality of blocks, the signal transmission of this invention is applicable to signal transmission between the respective blocks.

Fifth Embodiment

Figure 42:
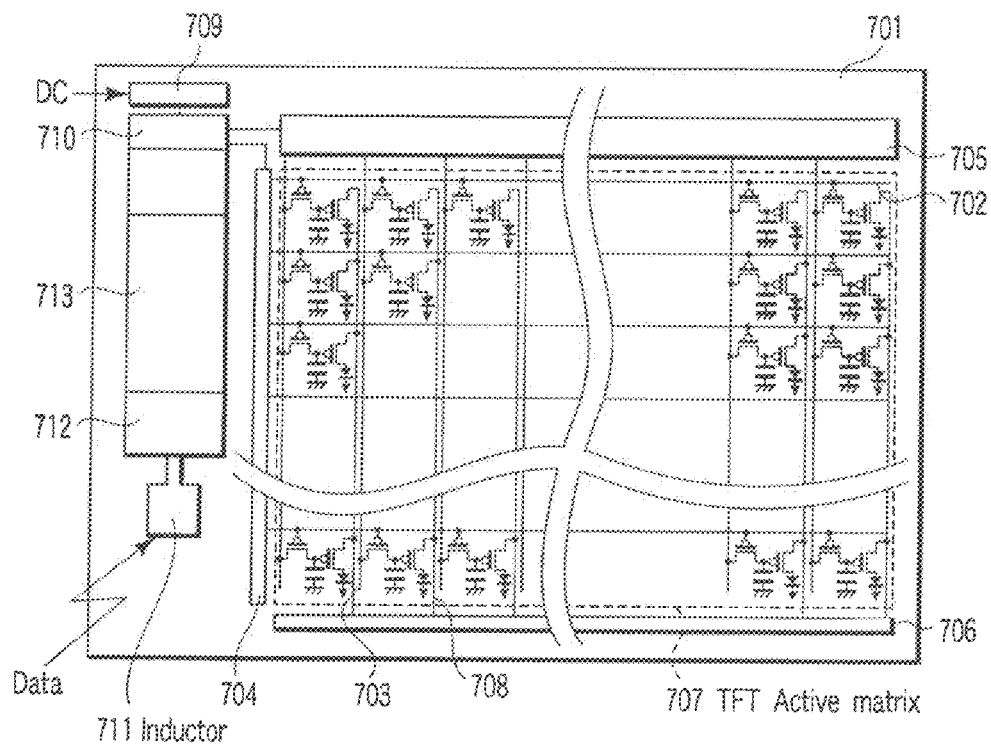
FIG. 42 shows the entire structure of a liquid crystal display device according to a fifth embodiment of the invention.

FIG. 42 shows the structure of an active-matrix display device according to a fifth embodiment of the present invention. A plurality of scanning lines 702 and a plurality of video signal lines 703 are arranged in a matrix on a non-alkali glass substrate 701. In addition, a TFT active matrix display section 707, in which two P-type thin-film transistors and a capacitor element are disposed in each of rectangular pixel regions defined by the scanning lines 702 and video signal lines 703, and a scanning circuit 704 and a signal supply circuit 705, which are composed of TFTs, are disposed on the non-alkali glass substrate 701. In this embodiment, an electric current is supplied to organic LED elements to cause the organic LED elements to emit light, thereby executing a display operation. A current supply source 706, which supplies a current to the organic LED elements, is formed on the same substrate, and supplies a current to the transistors in the TFT active-matrix display section 707 through current supply lines 708.

A DC-DC converter circuit 709, which converts an externally supplied power supply voltage DC and supplies a voltage necessary for the driving circuits 704 and 705, and a timing control circuit 710, which receives video data, control signals, etc., executes necessary processing for them and supplies the processed data, control signals, etc. to the driving circuits 704 and 705, are also composed of TFTs and integrated on the glass substrate.

In the present embodiment, an inductor 711, which is composed of a metal thin film, is formed on a region of the glass substrate at a position outside the TFT active-matrix display section 707 as an element for receiving compressed image data that is supplied from outside. The inductor 711 is connected to a data processing circuit including a signal amplification circuit 712 and an expansion circuit for expanding compressed data. In addition, a semiconductor memory circuit 713, which temporarily stores compressed image data and is used at a time of data expansion processing, is formed of TFTs at a position neighboring the data processing circuit. These circuits and memory circuit 713 are all composed of TFTs on the glass substrate.

Figure 43:
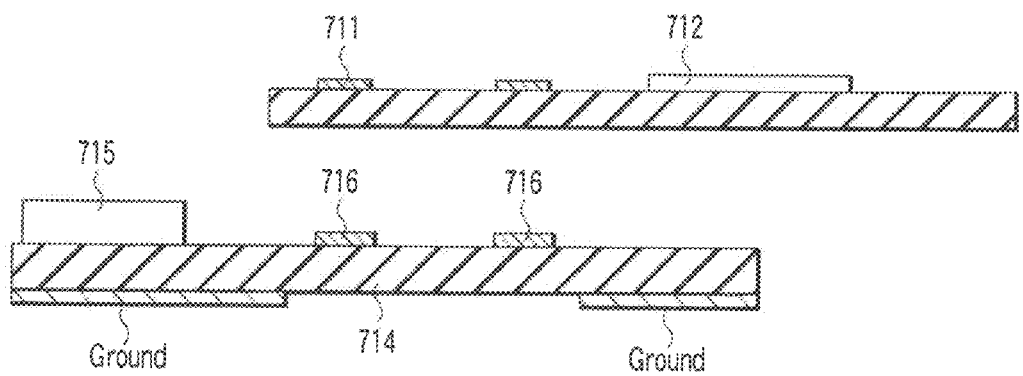
FIG. 43 is a schematic cross-sectional view of an inductive-coupling type non-contact transmission path in the fifth embodiment of the invention.

FIG. 43 is a schematic cross-sectional view of an inductive-coupling type non-contact transmission path which is constituted by the inductor element 711 formed on the display substrate and another inductor element TL formed on a system substrate 714 that constitutes a data-transmission-side system.

An image data transmission circuit 715 and an inductor 716 with self-inductance L1 are formed on the system substrate 714, and the inductor 716 is disposed substantially coaxial with the inductor 711 with self-inductance L2 that is formed on the display substrate. A signal voltage from the image data transmission circuit 715 is transmitted from the inductor 716 to the inductor 711 via a mutual inductance Lm therebetween, and the transmitted signal voltage is amplified by the TFT in the data processing circuit and stored in the memory.

Figure 44:
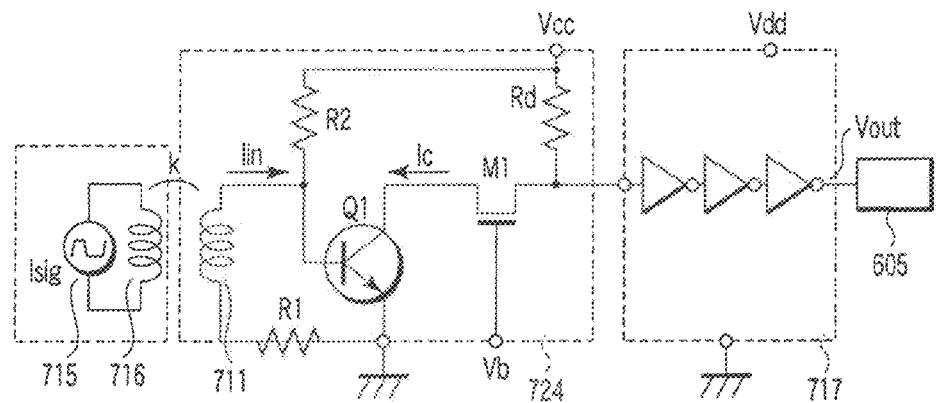
FIG. 44 shows the structure of a signal interface circuit in the fifth embodiment of the invention.

FIG. 44 shows a circuit configuration in which a lateral bipolar transistor is used in the amplification circuit 712 of a signal that is received by an inductor RL in the above-described system.

In the present system, a signal transmission path is formed by electromagnetic coupling (coupling coefficient: k) between the two mutually opposed inductors 716 and 711. In the transmission circuit, a signal is generated by varying a current, which is supplied to the transmission-side inductor 716, in a range of between 0 and 2 mA. In the receiving-side inductor 711, a current that is proportional to the current variation ratio of the Isig and the coupling coefficient k occurs only while the Isig is varying. This signal has a small amplitude of several μA, and it is difficult to directly convert the signal to a voltage in the MOS-type TFT circuit. Thus, the signal current is once amplified by a lateral bipolar transistor Q1, and the amplified current is converted to cascode-connected M1 and Rd. The resultant voltage is supplied to and amplified by an amplification circuit 717. In FIG. 44, R1 and R2 are resistors for supplying a bias current. In the present circuit, since the amplitude of the current that is detected by the inductor 711 is small, a bias current is supplied to the transistor Q1 so that the transistor Q1 is set at a proper operation point.

Figure 45:
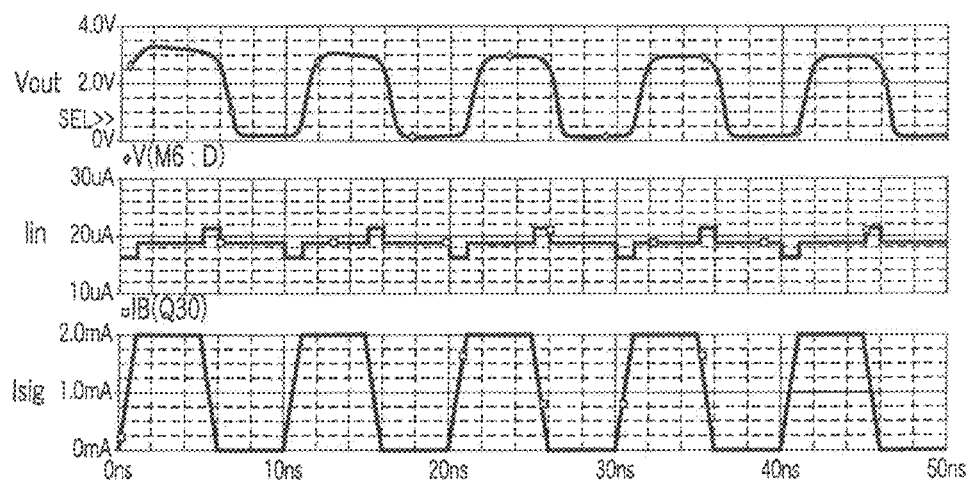
FIG. 45 shows a signal current waveform, a detection current waveform and an output voltage waveform of the signal interface circuit in the fifth embodiment of the invention.

FIG. 45 shows waveforms of the current Isig of the input signal transmission-side inductor, the current Iin of the reception-side inductor, and the output voltage Vout of the amplification circuit. It is understood that proper signal transmission is performed. A signal of a lower level can be detected by using the lateral bipolar transistor in the non-contact type signal transmission system using the inductors as in the present embodiment. Therefore, a noise margin at a time of transmission can be secured, and a transmission speed can be increased.

Sixth Embodiment

Figure 46:
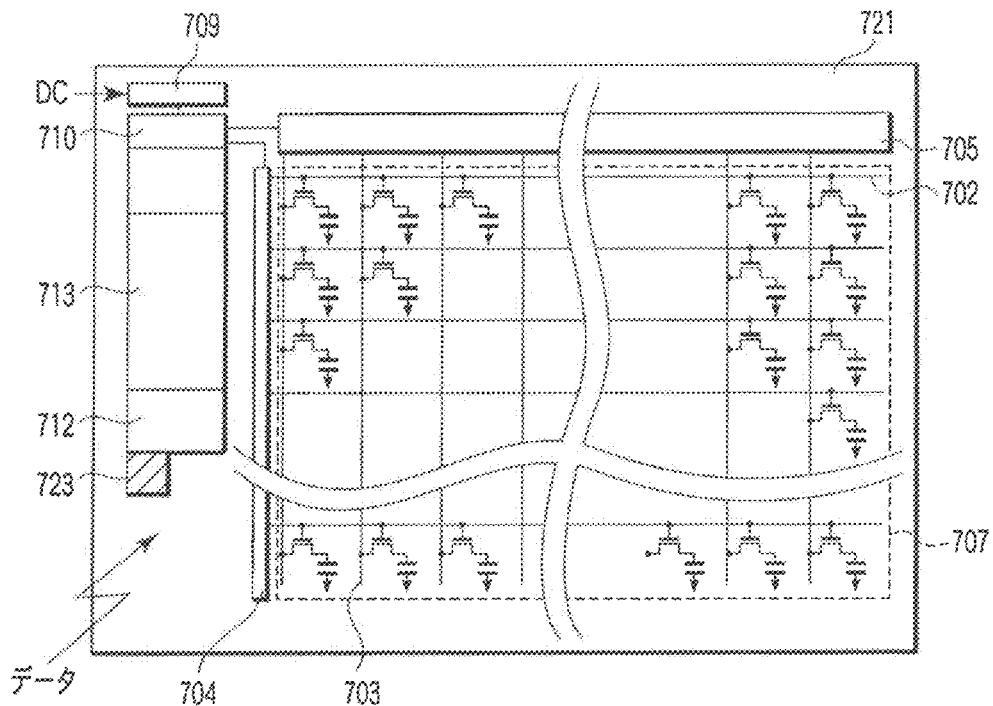
FIG. 46 shows the entire structure of a liquid crystal display device according to a sixth embodiment of the invention.
Figure 47:
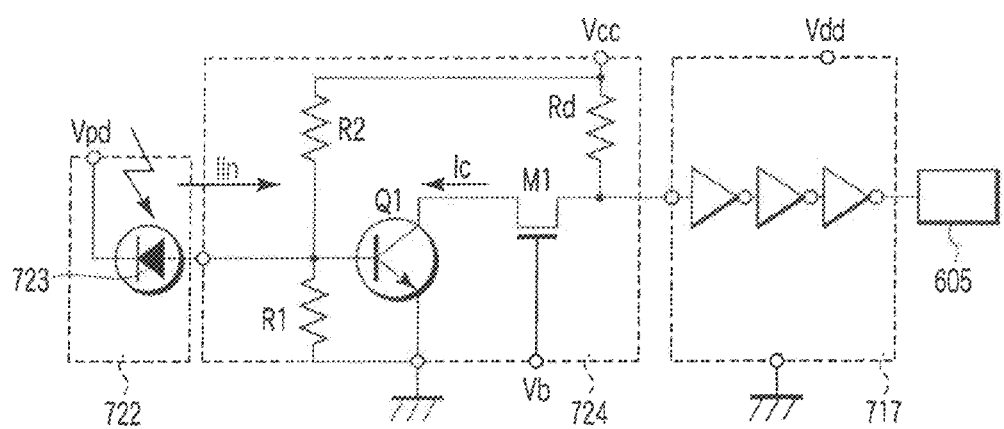
FIG. 47 shows the structure of a signal interface circuit in the sixth embodiment of the invention.

FIG. 46 and FIG. 47 show a display substrate 721 and a light-detecting circuit 722 according to a sixth embodiment of the present invention. The signal transmission by the capacitive coupling in the fifth embodiment is replaced with non-contact signal transmission by optical coupling. In this embodiment, an optical transmission path is used as transmission means. A photosensor, instead of the capacitance and inductor, is integrated on a display substrate 721. FIG. 47 shows an example of the structure of the circuit that receives a signal current from the photosensor. In this example, the circuit includes a photodiode 723 which is formed of a single-crystal silicon thin film, and an interface circuit 724. The interface circuit 724 has the same structure as in the fifth embodiment. A current signal from the photodiode 723 is amplified and converted to a voltage signal, and the voltage signal is delivered to the serial/parallel conversion circuit.

By using light as signal transmission means, the effect of electromagnetic noise can be eliminated. In addition, by using the bipolar transistor in the input section, a good SN ratio can be achieved. Hence, the transmission speed can be enhanced. In particular, since the photodiode formed of the single-crystal silicon thin film is provided on the transparent glass substrate, a signal can be received regardless of whether the transmission circuit is disposed on a front surface or a back surface of the glass substrate. Therefore, the degree of freedom of mounting design can be increased.

The present invention is usable as an image display device for a mobile information terminal or a mobile phone, or as an image display device of an information apparatus such as a personal computer.

In the present specification, various embodiments have been described by way of example. However, consideration should be given to possible variations in the embodiments without departing from the substantial features recited in the patent claims. The description in the specification is intended to demonstrate the invention, but not to restrict the invention.

What is claimed is:

1. A method of fabricating a thin-film transistor, the method comprising:
    forming a semiconductor thin film including a non-single-crystal region on an insulating substrate, the semiconductor thin film having a T shaped pattern formed by a lateral portion and a width portion extended from the lateral portion;
    radiating a pulse laser beam with an inverted peak pattern shape on the non-single-crystal region, thereby forming at least one crystallized region, the at least one crystallized region including at least one single-crystal grain which is crystallized in a lateral direction; and
    forming an MOS-bipolar hybrid thin film transistor including a lateral bipolar thin-film transistor and a MOS thin-film transistor in the at least one crystallized region, wherein the MOS thin-film transistor and the lateral bipolar thin-film transistor are formed in the lateral portion, the MOS thin-film transistor includes a source region, a channel region and a drain region, which are formed in the semiconductor thin film,
    the lateral bipolar thin-film transistor includes an emitter, a base and a collector, which are formed in the semiconductor thin film, and the lateral bipolar thin-film transistor includes a base contact portion which is formed in the width portion and electrically connected to the base.

2. The method according to claim 1, wherein the base contact portion has an impurity concentration higher than the collector.

3. The method according to claim 2, wherein the lateral bipolar thin-film transistor includes a collector contact portion which is formed in the width portion and electrically connected to the collector and which has an impurity concentration higher than the collector.

4. The method according to claim 1, wherein radiating the pulse laser beam forms substantially rectangular single-crystal regions, which are arranged with a pitch.

5. The method according to claim 1, wherein the base has a width of at least 5 µm, the width being normal to the lateral direction.

6. A method of fabricating a thin-film transistor, the method comprising:
    forming a semiconductor thin film including a non-single-crystal region on an insulating substrate, wherein the semiconductor thin film has a T shaped pattern formed by a lateral portion and a width portion extended from the lateral portion;
    radiating a pulse laser beam with an inverted peak pattern shape on the non-single-crystal region, thereby forming at least one crystallized region, the at least one crystallized region including at least one single-crystal grain which is crystallized in a lateral direction; and
    forming an MOS-bipolar hybrid thin film transistor including a lateral bipolar thin-film transistor and a MOS thin-film transistor in the at least one crystallized region, wherein the MOS thin-film transistor and the lateral bipolar thin-film transistor are formed in the lateral portion, the MOS thin-film transistor includes a source region, a channel region and a drain region, which are formed in the semiconductor thin film,
    the lateral bipolar thin-film transistor includes an emitter, a base and a collector, which are formed in the semiconductor thin film, and the lateral bipolar thin-film transistor includes a collector contact portion which is formed in the width portion and electrically connected to the collector.

7. The method according to claim 6, wherein the collector contact portion has an impurity concentration higher than the collector.

8. The method according to claim 6, wherein radiating the pulse laser beam forms substantially rectangular single-crystal regions, which are arranged with a pitch.

9. The method according to claim 6, wherein the base has a width of at least 5 µm, the width being normal to the lateral direction.

* * * * *